United States Patent
Lee et al.

(10) Patent No.: US 9,015,389 B2
(45) Date of Patent: Apr. 21, 2015

(54) VOLATILE MEMORY DEVICE AND MEMORY CONTROLLER

(71) Applicant: Samsung Electronics Co., Ltd., Suwon-si (KR)

(72) Inventors: Jae-Woong Lee, Seoul (KR); Hyong-Ryol Hwang, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 37 days.

(21) Appl. No.: 14/031,897

(22) Filed: Sep. 19, 2013

(65) Prior Publication Data

US 2014/0089577 A1 Mar. 27, 2014

(30) Foreign Application Priority Data

Sep. 26, 2012 (KR) .......................... 10-2012-0107485

(51) Int. Cl.
| G06F 3/00 | (2006.01) |
| G06F 13/12 | (2006.01) |
| G06F 13/38 | (2006.01) |
| G06F 12/00 | (2006.01) |
| G06F 13/00 | (2006.01) |
| G06F 13/28 | (2006.01) |
| G11C 11/406 | (2006.01) |

(52) U.S. Cl.
CPC ................................. G11C 11/40615 (2013.01)

(58) Field of Classification Search
None
See application file for complete search history.

(56) References Cited

U.S. PATENT DOCUMENTS

| 6,137,743 | A | * | 10/2000 | Kim ............................... 365/222 |
| 6,141,279 | A | | 10/2000 | Hur et al. |
| 6,937,534 | B2 | | 8/2005 | Lim et al. |
| 7,317,648 | B2 | | 1/2008 | Jo |
| 7,340,632 | B2 | | 3/2008 | Park |
| 7,447,097 | B2 | | 11/2008 | Hwang et al. |
| 7,787,322 | B2 | | 8/2010 | Im et al. |
| 2002/0191467 | A1 | * | 12/2002 | Matsumoto et al. .......... 365/222 |
| 2005/0185493 | A1 | * | 8/2005 | Fujioka et al. ........... 365/230.05 |
| 2008/0212386 | A1 | * | 9/2008 | Riho .............................. 365/222 |
| 2011/0216612 | A1 | * | 9/2011 | Ishikawa ....................... 365/194 |
| 2011/0246713 | A1 | | 10/2011 | Bains |
| 2012/0079182 | A1 | | 3/2012 | Bains |

FOREIGN PATENT DOCUMENTS

| KR | 2000-0065733 A | 11/2000 |
| KR | 2004-0006767 A | 1/2004 |
| KR | 2004-0078477 A | 9/2004 |

(Continued)

*Primary Examiner* — Kris Rhu
(74) *Attorney, Agent, or Firm* — Muir Patent Law, PLLC

(57) ABSTRACT

A volatile memory device includes a memory cell array, a command decoder, a self-refresh circuit, and a register. The command decoder is configured to decode a self-refresh entry command, a self-refresh exit command, and a register read command based on external command signals received from outside the volatile memory device. The self-refresh circuit is configured to automatically refresh the memory cell array during a self-refresh mode which be entered in response to the self-refresh entry command and be exited in response to the self-refresh exit command. The register is configured to store an accessible state in response to the self-refresh exit command, and output the stored accessible state in response to the register read command. The accessible state indicates whether or not the memory cell array is ready to be read or written.

20 Claims, 18 Drawing Sheets

(56) References Cited

FOREIGN PATENT DOCUMENTS

| KR | 0548566 | 1/2005 |
|----|---------|--------|
| KR | 0655288 | 5/2006 |
| KR | 0772694 | 4/2007 |
| KR | 0800146 | 11/2007 |
| KR | 0892725 B1 | 4/2009 |

* cited by examiner

VOLATILE MEMORY DEVICE AND MEMORY CONTROLLER

CROSS-REFERENCE TO RELATED APPLICATIONS

This application claims the benefit of Korean Patent Application No. 10-2012-0107485, filed on Sep. 26, 2012, in the Korean Intellectual Property Office, the disclosure of which is incorporated herein in its entirety by reference.

BACKGROUND

This disclosure relates to a volatile memory device, and more particularly, to a volatile memory device performing a self-refresh, and a memory controller used with the volatile memory device performing a self-refresh.

Volatile memory device, such as dynamic random access memory (DRAM), is refreshed periodically to prevent loss of data. A self-refresh mode refers to a mode in which the volatile memory device is refreshed through a timer to reduce power consumption. When the volatile memory device is in the self-refresh mode, an external controller does not know the state of the volatile memory device. Thus, external controller may send a self-refresh exit command to the volatile memory device to exit from the self-refresh mode, stand by for a predetermined time, and then output a valid command. Latency after the self-refresh exit command typically increases with an increase in a capacity of the volatile memory device. Therefore, the latency of the volatile memory device may need to be reduced.

SUMMARY

The present disclosure provides a volatile memory device having a decreased latency and a memory controller connected to the volatile memory device.

According to one embodiment, there is provided a volatile memory device including a memory cell array, a command decoder, a self-refresh circuit, and a register. The memory cell array includes a plurality of word lines, a plurality of bit lines, and a plurality of memory cells connected to the word lines and bit lines. The command decoder is configured to decode a self-refresh entry command, a self-refresh exit command, and a register read command based on external command signals received from outside the volatile memory device. The self-refresh circuit is configured to automatically refresh the memory cell array during a self-refresh mode which be entered in response to the self-refresh entry command and be exited in response to the self-refresh exit command. The register is configured to store an accessible state in response to the self-refresh exit command, and output the stored accessible state in response to the register read command. The accessible state indicates whether or not the memory cell array is ready to be read or written.

According to one embodiment, there is provided a volatile memory device including a memory cell array, a command decoder, a self-refresh circuit, and an output buffer. The memory cell array includes a plurality of word lines, a plurality of bit lines, and a plurality of memory cells connected to the word lines and bit lines. The command decoder is configured to decode a self-refresh entry command and a self-refresh exit command based on external command signals received from outside the volatile memory device. The self-refresh circuit is configured to automatically refresh the memory cell array during a self-refresh mode which be entered in response to a self-refresh entry command and be exited in response to a self-refresh exit command. The output buffer is configured to output an accessible state in response to the self-refresh exit command. The accessible state indicates whether or not the memory cell array is ready to be read or written.

According to one embodiment, a method of operating a memory device including a plurality of memory cells connected to word lines and bit lines is provided. The method includes entering a self-refresh mode by the memory device after receiving a self-refresh entry command, generating a self-refresh state signal having alternating enabled and disabled time periods during the self-refresh mode, restoring data in a first set of memory cells connected to one or more selected word lines, and then pre-charging one or more bit lines associated with the first set of memory cells to a predetermined voltage level during the enabled time period of the self-refresh state signal, exiting the self-refresh mode of the memory device after receiving a self-refresh exit command, storing a state of the self-refresh state signal during the self-refresh mode, and outputting the stored state to an external pin of the memory device in response to the self-refresh exit command being received.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
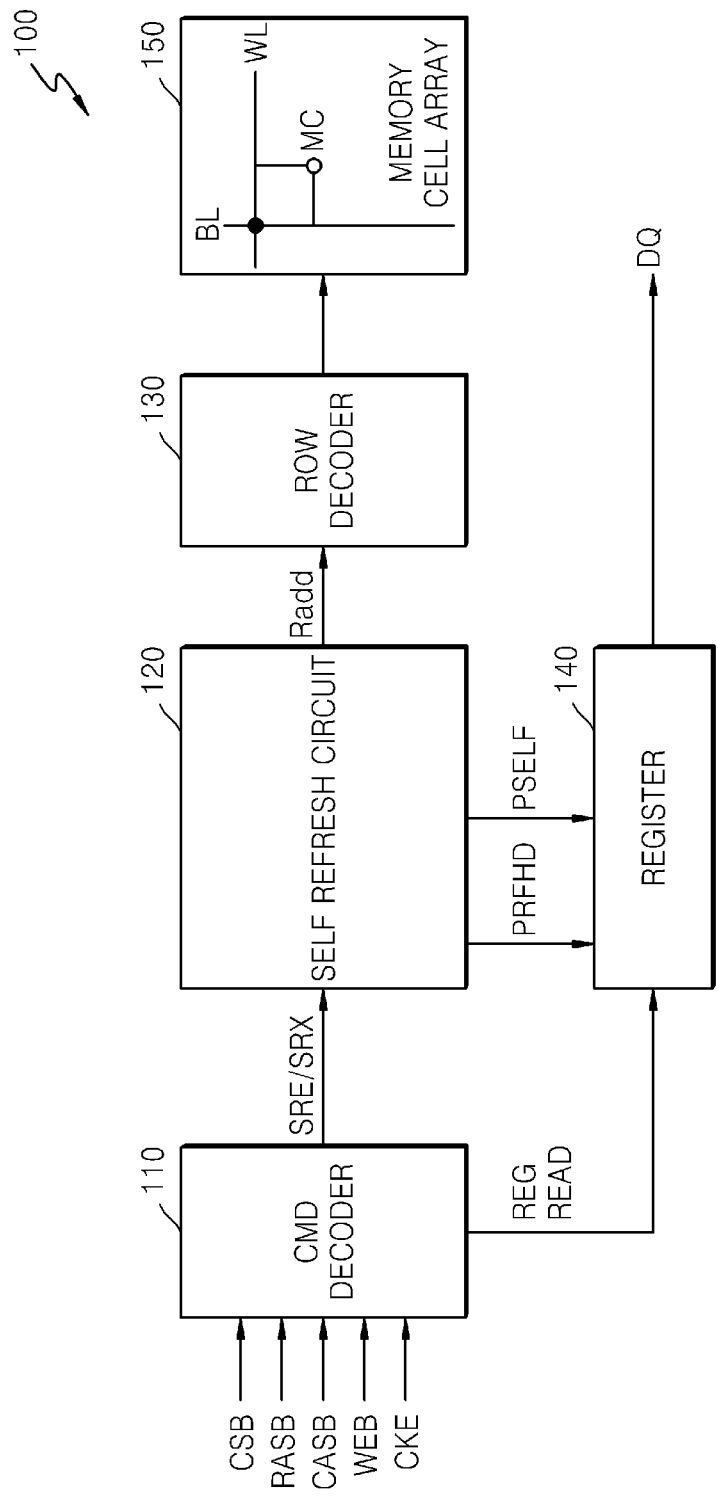
FIG. 1 is a schematic block diagram of a volatile memory device according to an exemplary embodiment.

The present disclosure will now be described more fully with reference to the accompanying drawings, in which exemplary embodiments of the invention are shown. The disclosure may, however, be embodied in many different forms and should not be construed as being limited to the embodiments set forth herein. In the drawings, the thicknesses of layers and regions are exaggerated for clarity.

The terminology used herein is for the purpose of describing particular embodiments only and is not intended to limit the example embodiments. As used herein, the singular forms "a," "an," and "the," are intended to include the plural forms as well, unless the context clearly indicates otherwise. It will be further understood that the terms, such as "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It will be understood that, although the terms, 'first', 'second', etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of the disclosed embodiments. As used herein, the term "and/or," includes any and all combinations of one or more of the associated listed items.

Unless otherwise defined, all terms (including technical and scientific terms) used herein have the same meaning as commonly understood by one of ordinary skill in the art to which the disclosed embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Various exemplary embodiments will now be described more fully with reference to the accompanying drawings in which some exemplary embodiments are shown.

FIG. 1 is a schematic block diagram of a volatile memory device 100 according to an exemplary embodiment.

Referring to FIG. 1, the volatile memory device 100 includes a command decoder 110, a self-refresh circuit 120, a low decoder 130, a circuit (e.g., register) 140, and a memory cell array 150.

The memory cell array 150 includes a plurality of memory cells (MCs). The MCs may be dynamic random access memories (DRAMs) including switching elements and capacitors. In the memory cell array 150, a plurality of word lines (WLs) intersect with a plurality of bit lines (BLs), and the MCs are respectively arrayed at points where the WLs intersect with the BLs. The WLs are connected to control terminals of the switching elements, and the BLs and the capacitors are connected to the switching elements. If the WLs are enabled, charges stored in the capacitors flow to the BLs, and charges of the BLs are stored in the capacitors.

The low decoder 130 selects the WLs of the memory cell array 150. The low decoder 130 selects the WLs in response to a refresh address Radd provided from the self-refresh circuit 120. The refresh address Radd will be described in more detail later. A column decoder (not shown) selects the BLs of the memory cell array 110.

The command decoder 110 decodes a self-refresh entry command SRE, a self-refresh exit command SRX, and a register read command REG READ based on external command signals CSB, RASB, CASB, WEB, and CKE received from outside the volatile memory device 100. The external command signals CSB, RASB, CASB, WEB, and CKE are also referred to as input command signals when being input to the semiconductor memory device. In certain embodiments, certain external commands may be implemented using a set of external command signals (e.g., CSB, RASB, CASB, WEB, and CKE) having a particular set of values. For example, one such external command may be one of the self-refresh entry command SRE, the self-refresh exit command SRX, and the register read command REG READ. Each of these external commands corresponds to a particular set of external command signal values, which may be decoded by a command decoder 110 to form the decoded entry commands (SRE/SRX/REG READ output from the command decoder 110).

The external command signal CSB is a chip selection signal, the command signal RASB is a low address strobe signal and operates as an enable command of an operation of a semiconductor memory device. The external command signal CASB is a column address strobe signal and indicates that a column address is sent to the semiconductor memory device. The external command signal WE is a write enable signal and commands whether to read data from or write data to the semiconductor memory device. The external command signal CKE is an external clock enable signal. The external command signals CSB, RASB, CASB, WEB, and CKE are provided from a memory controller (not shown) outside the volatile memory device 100.

If the external command signal CKE transits from a high level to a low level when the external command signals CSB, RASB, and CASB are at a low level, and the external command signal WEB is at a high level, the self-refresh entry command SRE is decoded (this may also be described as the self-refresh entry command SRE being received). The command decoder 110 transmits the self-refresh entry command SRE to the self-refresh circuit 120.

If the external command signal CKE transits from the low level to the high level when the external command signals CASB, RASB, and WEB are at a high level, the self-refresh exit command SRX is decoded (this may also be described as the self-refresh exit command SRX being received). The command decoder 110 transmits the self-refresh exit command SRX to the self-refresh circuit 120.

The register 140 may be a multi-purpose register. For example, the register read command REG READ may be generated by a command enabling a multi-purpose register (not shown) and a read command RD (not shown). In detail, to enable the multi-purpose register 140, for example, address A2 (not shown) is set to 1 to send a mode register set (MRS) command to a register of the command decoder 110. When the register read command REG READ is sent, data stored in the multi-purpose register may be read.

The self-refresh circuit 120 internally refreshes the memory cell array 150 (e.g., the memory cells) in response to the self-refresh entry command SRE and ends refreshing of the memory cell array 150 in response to the self-refresh exit command SRX. In other words, the self-refresh circuit 120 receives the self-refresh entry command SRE and then performs self-refreshing of the memory cell array 150 until receiving the self-refresh exit command SRX.

A self-refresh operation is internally performed not by an external refresh command in order to reduce power consumption. When the volatile memory device 100 receives the self-refresh entry command SRE from the memory controller, the volatile memory device 100 starts operating in a self-refresh mode. When the volatile memory device 100 receives the self-refresh exit command SRX, the volatile memory device 100 ends the operation of the self-refresh mode and may start operating in a normal mode (e.g., an active, a read or a write operation mode).

The volatile memory device 100 uses an internal clock signal not an external clock signal received from the memory controller during a self-refresh operation. Also, the memory controller does not know an operation state of the volatile memory device 100. Therefore, after the memory controller sends the self-refresh exit command SRX to the volatile memory device 100, stands by for a maximum time required for exiting from a self-refresh mode, and then sends another valid command (e.g., an active, a read, or a write command).

The maximum time required for exiting from the self-refresh mode is defined in the Join Electron for Devices Engineering Council (JEDEC) standards. For example, with reference to the JEDEC standards for Low Power Double Data Rate 2 (LPDDR2), the maximum time required for exiting from a self-refresh mode is defined as a "self refresh exit to next valid command delay" by using the symbol "tXSR." Also, tXSR is defined as "tRFCab+10 ns."

In this regard, tRFCab is a symbol of a parameter called a refresh cycle time and is 90 ns in the case of LPDDR2 of 64 Mb, 128 Mb, 256 Mb, and 512 Mb. However, in the case of LPDDR2 of 1 Gb, 2 Gb, and 4 Gb, tRFCab is 130 ns and is 210 ns in the case of LPDDR2 of 8 Gb. In the case of DDR3, tRFCab is 90 ns for 512 Mb, 110 ns for 1 Gb, 160 ns for 2 Gb, 300 ns for 4 Gb, and 350 ns for 8 Gb. In other words, since the memory controller does not know the operation states of the volatile memory device 100, after the memory controller sends external command signals corresponding to the self-refresh exit command, stands by for a time of tXSR, and then sends a next valid command (e.g., an active, a read, or a write command).

The refresh cycle time tRFCab is constant up to a predetermined capacity and increases with an increase of the predetermined capacity because the number of WLs to be performed in response to one refresh command increases. In the case of DDR2, a refresh count is a constant equal to 8192 regardless of the capacity. However, the number of WLs to be refreshed is proportional to the capacity. Therefore, if the capacity increases, a refresh operation is to be performed with respect to a plurality of WLs in response to one refresh command. For example, in the case of DDR2 of 4 Gb, 8 WLs are to be refreshed in response to one refresh command. As a result, the refresh cycle time tRFCab of DDR2 of 4 Gb may be 327.5 ns.

However, an average time tREFI of refresh commands is 15.6 μs in the case of LPDDR2 of 64 Mb and 128 Mb, is 7.8 μs in the case of LPDDR2 of 256 Mb and 512 Mb, and is 3.9 μs in the case of LPDDR2 of 2 Gb, 4 Gb, and 8 Gb. Also, in the case of DDR3, the average time tREFI of the refresh commands is 7.8 μs at a temperature lower than or equal to 85° C. or less and is 3.9 μs at a temperature higher than 85° C.

To perform the refresh operation, a probability of enabling WLs to sense and amplify data in the MCs, and disabling the WLs and pre-charging the BLs may be calculated through a ratio of a refresh cycle time to the average time tREFI of the refresh commands. For example, in the case of LPDDR2 of 8 Gb, a probability of enabling or pre-charging WLs is 210 ns/3.9 μs, i.e., 5.38%. The probability o DDR3 of 8 Gb is about 4.5%. If the volatile memory device 100 enables the WLs or pre-charges the BLs, the memory controller may not access the volatile memory device 100.

In other words, since the volatile memory device 100 enables the WLs or pre-charges the BLs, there is an about 5% probability that the memory controller will not access the volatile memory device 100. The other probability of about 95% is that the memory controller may immediately send an active command to the volatile memory device 100.

Therefore, if the volatile memory device 100 informs the memory controller that the volatile memory device 100 is in an accessible state, the memory controller may send the self-refresh exit command, and send a valid command immediately without standing by for a time of a self-refresh exit to next valid command delay tXSR.

Figure 2:
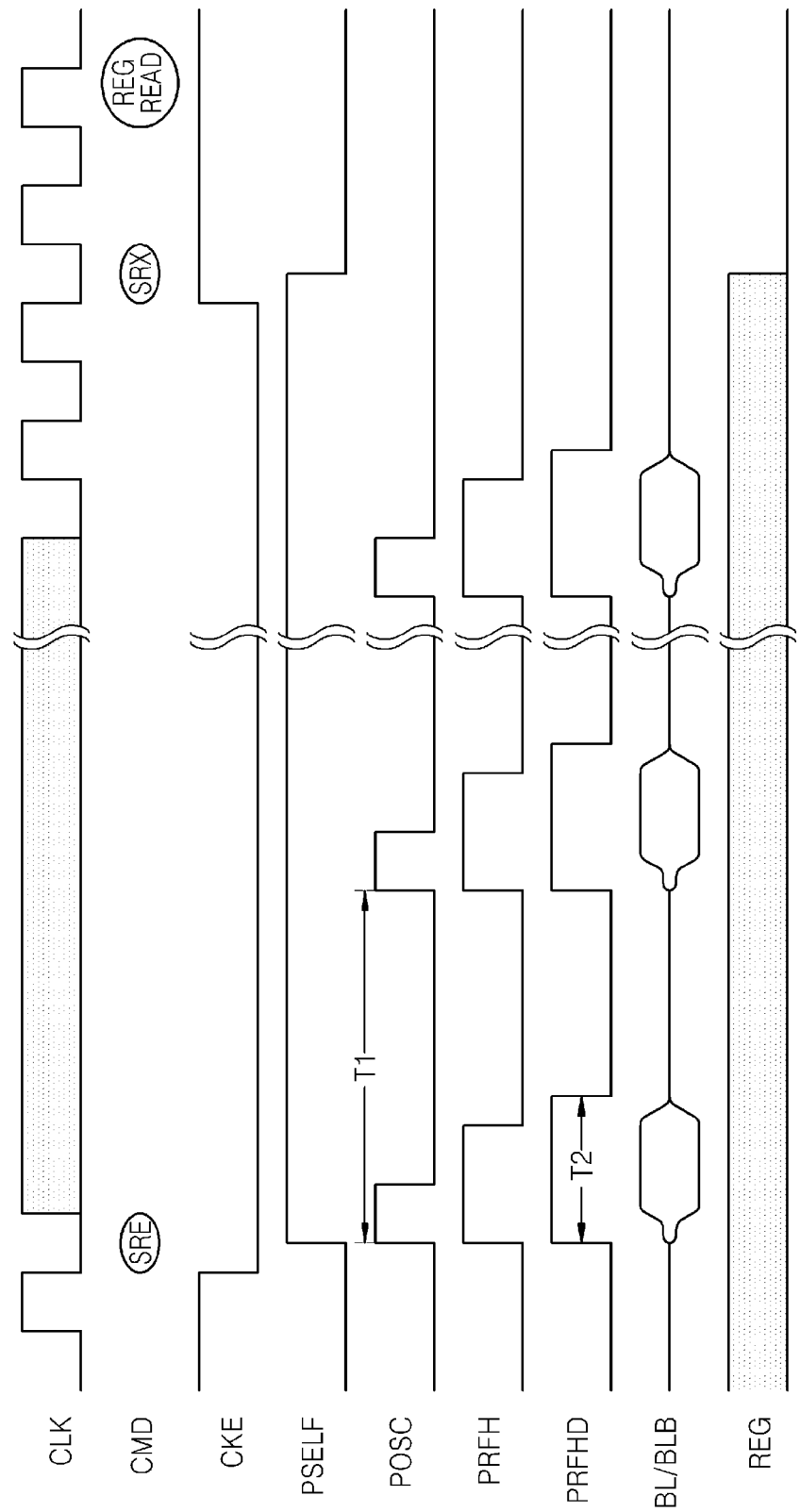
FIG. 2 is an exemplary timing diagram illustrating the volatile memory device of FIG. 1 being accessible when the volatile memory device receives external command signals corresponding to a self-refresh exit command.
Figure 3:
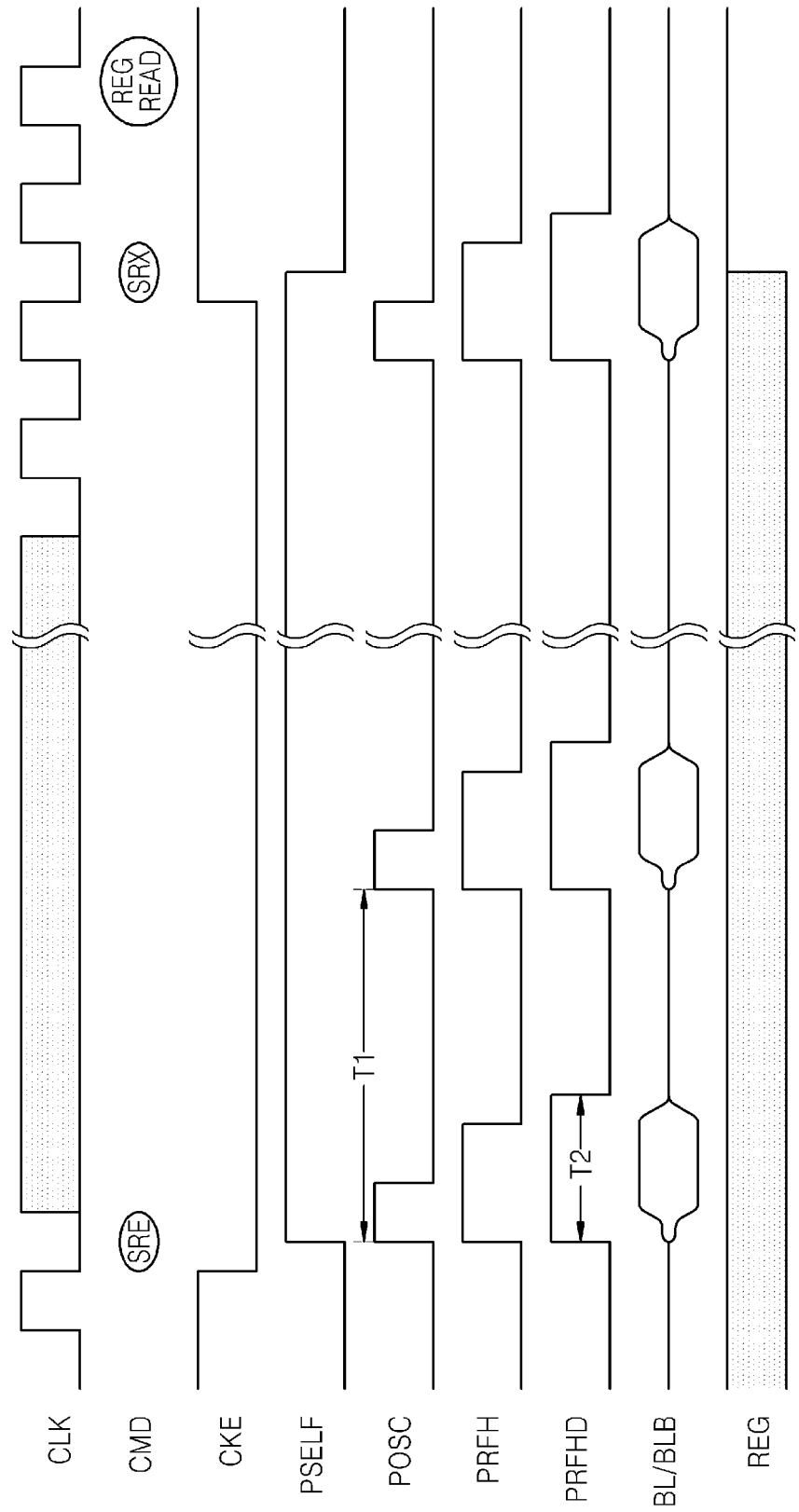
FIG. 3 is an exemplary timing diagram illustrating the volatile memory device of FIG. 1 not being accessible when the volatile memory device receives external command signals corresponding to the self-refresh exit command.

The self-refresh circuit 120 may be a circuit which performs a self-refresh operation to allow the volatile memory device 100 to operate in the self-refresh mode. The self-refresh circuit 120 generates various types of internal control signals as illustrated in FIGS. 2 and 3. The internal control signals include a self-refresh mode signal PSELF, a self-refresh pulse signal POSC, and a self-refresh state signal PRFHD.

For example, the self-refresh mode signal PSELF may be a signal which is enabled in response to the self-refresh entry command SRE and is disabled in response to the self-refresh exit command SRX. The self-refresh pulse signal POSC may be a pulse signal which is periodically generated every first time period T1 for an enable period of the self-refresh mode signal PSELF. The first time period T1 may be shorter than or equal to the average time tREFI of the refresh commands.

The self-refresh state signal PRFHD is enabled in response to the self-refresh pulse signal POSC and is disabled after a second time period T2. For example, the self-refresh state signal PRFHD may be a signal which is enabled every first time period T1 in response to the self-refresh pulse signal POSC and has the second time period T2 as a pulse width. The second time period T2 may be equal to or longer than the refresh cycle time tRFC. Within the second time period T2, the WLs of the memory cell array 150 are enabled to sense and amplify data (e.g., a restoring operation) stored in the MCs connected to the WLs, the WLs are then disabled, and the BLs are pre-charged to a predetermined voltage level.

The self-refresh circuit 120 has an internal clock to calculate the first and second time periods T1 and T2. The self-refresh circuit 120 increases a refresh row address one by one every first period T1 and refreshes memory cells associated the refresh row address.

The register 140 stores a state of the self-refresh state signal PRFHD in response to the self-refresh exit command SRX. For example, the state of the self-refresh state signal PRFHD indicates that the volatile memory device 100 is either accessible or not accessible. In detail, the register 140 stores a logic level of the self-refresh state signal PRFHD when the self-refresh mode signal PSELF transits from a high level to a low level in response to the self-refresh exit command SRX.

In one embodiment, if the logic level of the self-refresh state signal PRFHD is at a high level, the logic level indicates that the memory cell array 150 is not accessible from a controller. If the logic level of the self-refresh state signal PRFHD is a low level, the memory cell array 150 is accessible from the controller. The register 140 outputs stored state through a data input/output pad DQ in response to the register read command REG READ of the command decoder 110.

In the present disclosure, the data input/output pad DQ is an example of an input/output pad through which stored data (e.g., a state) in the register 140 is output. For example, the stored state in the register 140 may be output by using a data strobe pad DQS or a command and address parity input pad PAR as defined in the DRAM JEDEC standards, besides the data input/output pad DQ.

The data input/output DQ in the present disclosure includes not only the data input/output pad DQ defined in the DRAM JEDEC standard, and it should be understood that the data input/output DQ may include all types of pads or pins through which data is input and output. In detail, it will be understood that the data input/output pad DQ mentioned in the present disclosure includes a data strobe pad DQS or the command and address parity input pad PAR.

FIG. 2 is an exemplary timing diagram illustrating the volatile memory device 100 of FIG. 1 being accessible when the volatile memory device 100 receives a self-refresh exit command.

Referring to FIG. 2, an external clock signal CLK, a command CMD, an external command signal CKE, a self-refresh mode signal PSELF, a self-refresh pulse signal POSC, a self-refresh control signal PRFH, a self-refresh state signal PRFHD, BLs (e.g., BL/BLB), and a register signal REG are illustrated.

The external clock signal CLK oscillates with a predetermined period. The external clock signal CLK is provided from the memory controller to the volatile memory device 100. When the external command signal CKE transits from a high level to a low level, the self-refresh entry command SRE may be decoded according to other external command signals CSB, RASB, CASB, and WEB. The self-refresh mode signal PSELF indicates that the volatile memory device 100 operates in a self-refresh mode and transits to a high level in response to the self-refresh entry command SRE.

The self-refresh pulse signal POSC is generated by an internal clock of the volatile memory device 100 and may be a pulse signal generated every first time period T1. The first time period T1 may be equal to or shorter than an average time tREFI of refresh commands.

The self-refresh control signal PRFH transits to a high level in response to a rising edge of the self-refresh pulse signal POSC, maintains at the high level for a predetermined time, and is disabled. WLs are enabled in response to a rising edge of the self-refresh control signal PRFH and are disabled in response to a falling edge of the self-refresh control signal PRFH. When the WLs are disabled, a pre-charging operation may be performed.

With reference to timings of the BLs, the WLs are enabled in response to the rising edge of the self-refresh control signal PRFH, and thus, charge sharing starts between capacitors of MCs and BLs. After the charge sharing, a sense amplifier may perform a sensing operation. A charge difference between the BLs is amplified in the sensing operation. In response to the falling edge of the self-refresh control signal PRFH, WLs are disabled and a pre-charging operation is performed. As shown in the timing diagrams of the BLs, the BLs may be on the same level before the falling edge of the self-refresh state signal PRFHD.

The self-refresh state signal PRFHD transits to a high level in response to the rising edge of the self-refresh pulse signal POSC, maintains at the high level for a second time period T2, and is disabled. The second time period T2 may be equal to or longer than a refresh cycle time tRFC. The high level of the self-refresh state signal PRFHD indicates that data of selected memory cells are restored when the WLs are enabled or the pre-charging operation is not completed, and thus, the volatile memory device 100 may not perform an active operation. Alternatively, the high level of the self-refresh state signal PRFHD may indicate that the volatile memory device 100 is accessible.

In one embodiment, after the self-refresh entry command SRE is received, the external clock signal CLK may not be used. Therefore, the external clock signal CLK may oscillate for another period or is not provided from the memory controller. However, the external clock signal CLK oscillates again with a predetermined period before the self-refresh exit command SRX is received.

When the command signal CKE transits from a low level to a high level, the self-refresh exit command SRX is decoded. The self-refresh mode signal PSELF transits to a low level in response to the self-refresh exit command SRX.

When the self-refresh mode signal PSELF is disabled, the self-refresh pulse signal POSC is not generated anymore. Therefore, the self-refresh control signal PRFH and the self-refresh state signal PRFHD maintains at a low level.

The register 140 stores the self-refresh state signal PRFHD in response to a falling edge of the self-refresh mode signal PSELF. For example, the register 140 stores a logic level of the self-refresh state signal PRFHD when the self-refresh mode signal PSELF transits to a low level in response to the self-refresh exit command SRX. In FIG. 2, when the self-refresh mode signal PSELF transits to a low level, the self-refresh state signal PRFHD is at a low level. Therefore, the register 140 stores data of the low level, i.e., 0. The data stored in the register 140 is expressed as a register signal REG.

Before the self-refresh mode signal PSELF transits to a low level, the data stored in the register 140 may be a high level, a low level, or the same logic level as the self-refresh mode signal PSELF. Also, before the self-refresh mode signal PSELF transits to a low level, the data of the register signal REG may not be neither a high level nor a low level, and may be a high-impedance state, according to a type of the register 140.

The register read command REG READ may be decoded according to the command signals CSB, RASB, CASB, and WEB, and the volatile memory device 100 may output the data stored in the register 140, i.e., 0 in response to the register read command REG READ. For example, the stored data in the register 140 may output to an external pin of the volatile memory device 100 in response to the register read command REG READ. Accordingly, the volatile memory device 100 may access external command signals corresponding to a valid command without an additional delay when the self-refresh exit command SRX is received.

FIG. 3 is an exemplary timing diagram illustrating the volatile memory device 100 of FIG. 1 not being accessible when the volatile memory device 100 receives a self-refresh exit command.

Referring to FIG. 3, an external clock signal CLK, a command CMD, an external command signal CKE, a self-refresh mode signal PSELF, a self-refresh pulse signal POSC, a self-refresh control signal PRFH, a self-refresh state signal PRFHD, BLs, and a register signal REG are illustrated. Only the different parts of the timing diagram of FIG. 3 with respect to the timing diagram of FIG. 2 will be described.

Referring to the timing diagrams of FIGS. 2 and 3, the different part in FIG. 3 is that when the self-refresh mode signal PSELF transits to a low level, a logic level of the self-refresh state signal PRFHD is a high level.

If the volatile memory device 100 operates in a self-refresh mode, the memory controller may not know a state of the volatile memory device 100. The self-refresh mode signal PSELF transits to a low level in response to a self-refresh exit command SRX. If a charge sharing operation or a sensing operation is performed or a pre-charging operation is not completed when the self-refresh mode signal PSELF transits to a low level, the volatile memory device 100 may not execute a new active command to keep data. As shown in FIG. 3, the performance of the charge sharing operation or the sensing operation or the incompletion of the pre-charging operation may be expressed by the self-refresh state signal PRFHD at a high level.

The register 140 stores data (e.g., a state) of the self-refresh state signal PRFHD in response to a falling edge of the self-refresh mode signal PSELF. In FIG. 3, when the self-refresh mode signal PSELF transits to a low level, the self-refresh state signal PRFHD is at a high level. Therefore, the register 140 may store data at a high level, i.e., 1. A register read command REG READ may be decoded according to the command signals CSB, RASB, CASB, and WEB, and the volatile memory device 100 may output the data stored in the register 140, i.e., 1 through an external pin of the volatile memory device 100. A signal output from the register 140 may be expressed as the register signal REG.

Figure 4:
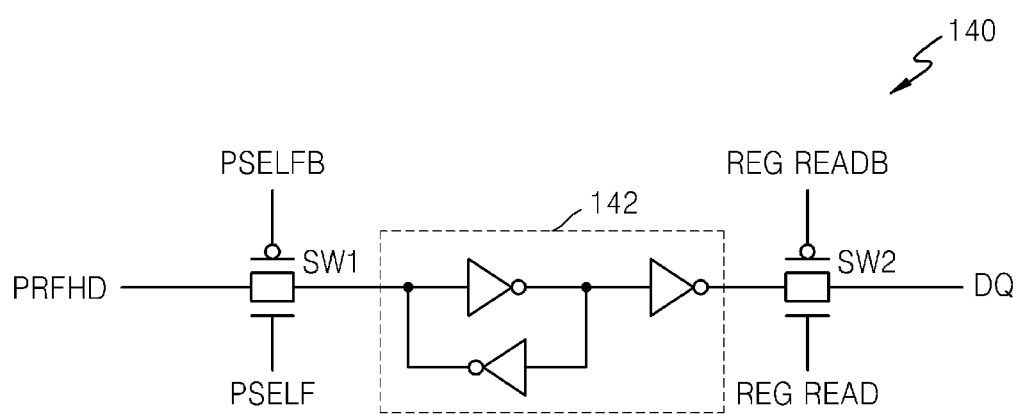
FIG. 4 is a block diagram illustrating a register of the volatile memory device according to an exemplary embodiment.

FIG. 4 is a block diagram of the register 140 of the volatile memory device 100 of FIG. 1, according to an exemplary embodiment.

Referring to FIG. 4, the register 140 includes a first switch SW1, a buffer 142, and a second switch SW2.

The first switch SW1 provides a self-refresh state signal PRFHD to an input terminal of the buffer 142 in response to a self-refresh mode signal PSELF.

The buffer 142 stores a logic level of the self-fresh stat signal PRFHD and may include a plurality of inverters as shown in FIG. 4.

The second switch SW2 outputs data stored in the buffer 142 to an external pad of the volatile memory device 100, such as a data input/output pad DQ in response to a register read command REG READ.

In an enabled period of the self-refresh mode signal PSELF, the first switch SW1 is closed, and a logic level of the self-refresh state signal PRFHD is stored in the buffer 142. In other words, if the self-refresh state signal PRFHD transits to a high level, a high logic level "1" may be stored in the buffer 142. If the self-refresh state signal PRFHD transits to a low level, a low logic level "0" may be stored in the buffer 142.

If the self-refresh mode signal PSELF transits to a low level, the first switch SW1 is opened, and the buffer 142 maintains stored data before the first switch SW1 is opened. Therefore, the buffer 142 may store a logic level of the self-refresh state signal PRFHD when the self-refresh mode signal PSELF transits to a low level.

If the register read command REG READ is enabled, the data stored in the buffer 142 is output to the data input/output pad DQ of the volatile memory device 100.

A self-refresh mode bar signal PSELFB is an inverted signal of the self-refresh mode signal PSELF, and a register read bar command REG READB is an inverted signal of the register read command REG READ.

Figure 5:
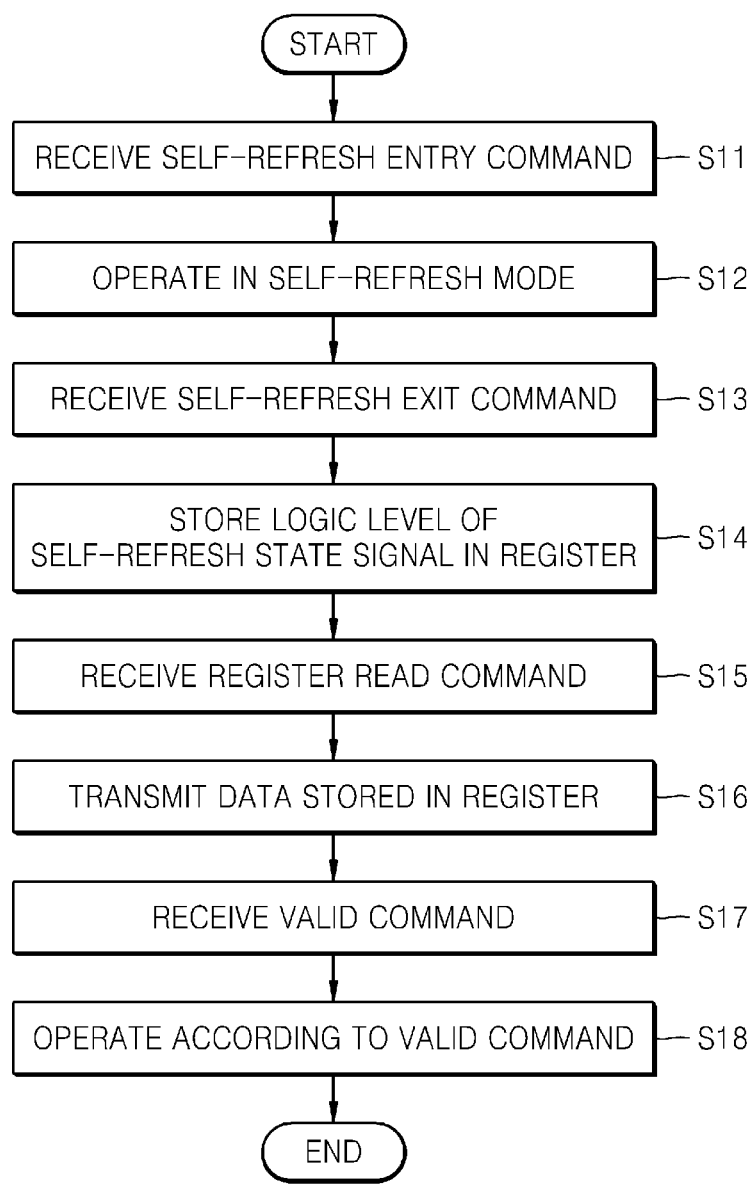
FIG. 5 is a flowchart illustrating an operation of the volatile memory device according to an exemplary embodiment.

FIG. 5 is a flowchart illustrating an operation of a volatile memory device according to an exemplary embodiment.

Referring to FIG. 5, in operation S11, the volatile memory device receives a self-refresh entry command SRE from a memory controller. In operation S12, the volatile memory device operates in a self-refresh mode when a memory cell array is internally refreshed by using an internal clock, in response to the self-refresh entry command SRE.

In operation S13, the volatile memory device receives a self-refresh exit command SRX from the memory controller. In operation S14, the volatile memory device stores a logic level of a self-refresh state signal PRFHD in the register 140 in response to the self-refresh exit command SRX.

In operation S15, the volatile memory device receives a register read command REG READ from the memory controller. In operation S16, the volatile memory device transmits the data stored in the register 140 to the memory controller.

In operation S17, the volatile memory device receives a valid command (e.g., an active, a read, or a write command) from the memory controller. In operation S18, the volatile memory device operates in a normal mode (e.g., an active, a read, or a write operation mode) according to the valid command.

Figure 6:
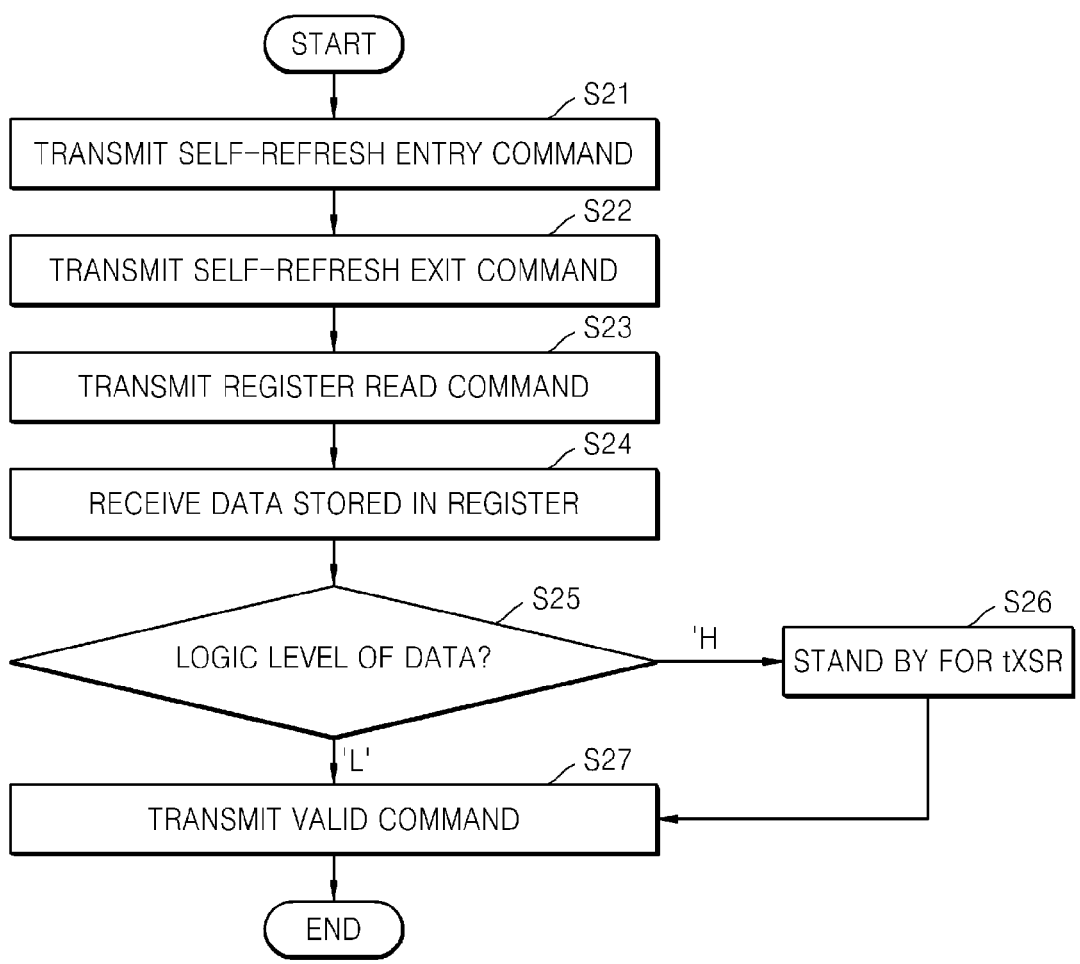
FIG. 6 is a flowchart illustrating an operation of a memory controller connected to a volatile memory device according to an exemplary embodiment.

FIG. 6 is a flowchart illustrating an operation of a memory controller connected to a volatile memory device according to an exemplary embodiment.

Referring to FIG. 6, in operation S21, the memory controller transmits a self-refresh entry command SRE to the volatile memory device. When the volatile memory device receives the self-refresh entry command SRE, the volatile memory device may operate in a self-refresh mode where a memory cell array is internally refreshed by using an internal clock, in response to the self-refresh entry command SRE.

In operation S22, the memory controller transmits a self-refresh exit command SRX to the volatile memory device. When the volatile memory device receives the self-refresh exit command SRX, the volatile memory device may store a logic level of a self-refresh state signal PRFHD in the register 140 in response to the self-refresh exit command SRX.

In operation S23, the memory controller transmits a register read command REG READ to the volatile memory device. When the volatile memory device receives the register read command REG READ, the volatile memory device may transmit the data stored in the register 140 to the memory controller in response to the register read command REG READ. In operation S24, the memory controller receives the data stored in the register 140 from the volatile memory device. In operation S25, the memory controller determines a logic level of the received data.

If the logic level of the received data is a low level, the volatile memory device is in an accessible state, and thus, the memory controller transmits a valid command to the volatile memory device without an additional standby time in operation S27. Although the logic level of the received data is a low level, the self-refresh state signal PRFHD may transit to a low level immediately before receiving the self-refresh exit command SRX. Therefore, a margin time (e.g., to complete a self-refresh operation) may pose a problem. However, a time required for transmitting the register read command REG READ and receiving the data stored in the register 140 is longer than the margin time. Therefore, as soon as the memory controller receives the data of the low level, the memory controller may transmit the valid command to the volatile memory device.

On the other hand, if the logic level of the received data is a high level, the volatile memory device is not in an accessible state, and thus, the memory controller stands by for a third time period in operation S26. The third time period may be equal to or longer than a time between a self-refresh exit and a next valid command delay tXSR. The third time period may be calculated from a time when the self-refresh exit command SRX is transmitted. The memory controller stands by for the third time period after transmitting the self-refresh exit command SRX and then transmits the valid command to the volatile memory device in operation S27.

As described above, if the volatile memory device does not inform the memory controller about an accessible or inaccessible state thereof, the memory controller transmits the self-refresh exit command SRX and stands by for the time between a self refresh exit and the next valid command delay tXSR. However, according to the disclosed embodiments, after the memory controller transmits the self-refresh exit command SRX, the memory controller knows an accessible or inaccessible state of the volatile memory device through a state of the register. If the volatile memory device is in the accessible state, the memory controller transmits a valid command (e.g., an active, a read, or a write command) to the volatile memory device without an additional standby time in order to reduce the standby time. This is because the memory controller transmits the register read command REG READ, and a time required for receiving data stored in a register is shorter than the time between a self refresh exit and the next valid command delay tXSR.

Figure 7:
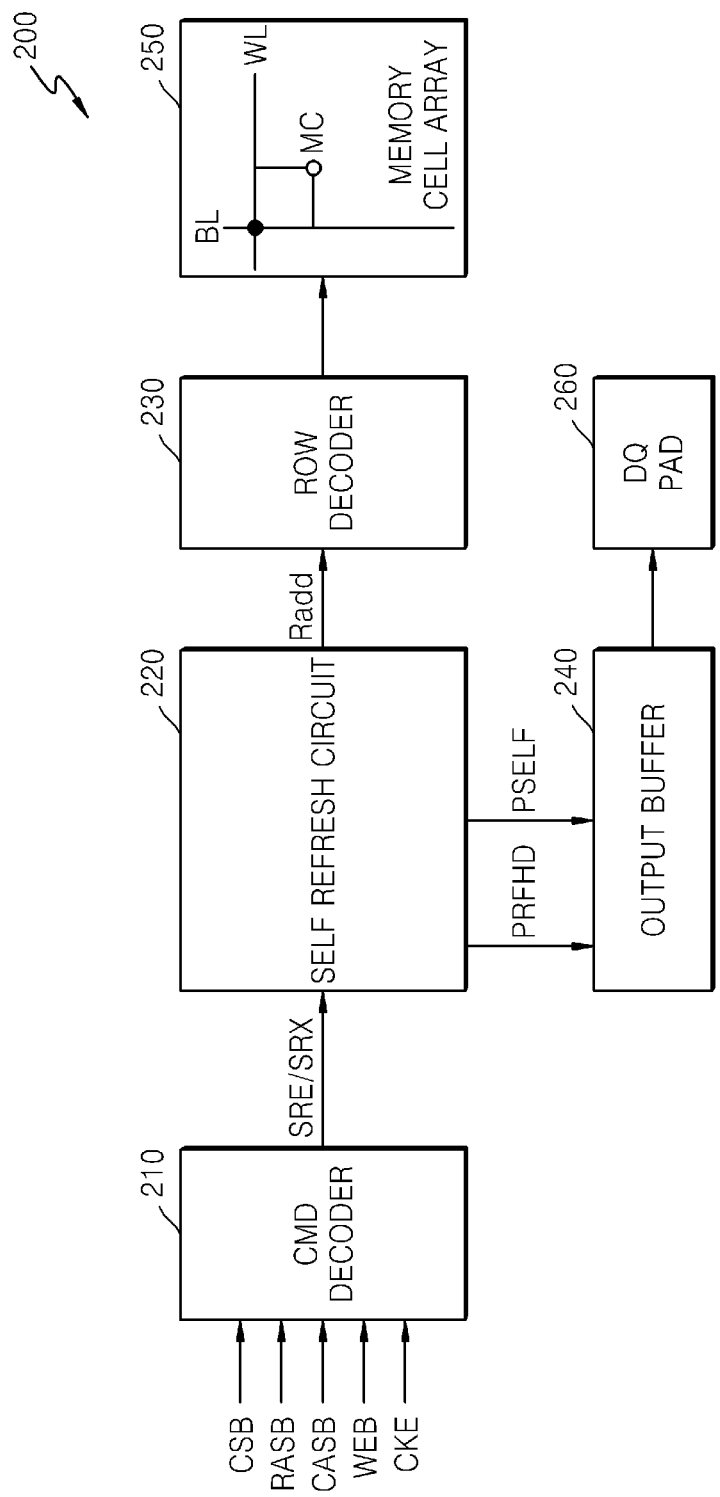
FIG. 7 is a schematic block diagram of a volatile memory device according to another exemplary embodiment.

FIG. 7 is a schematic block of a volatile memory device 200 according to another exemplary embodiment.

Referring to FIG. 7, the volatile memory device 200 includes a command decoder 210, a self-refresh circuit 220, a low decoder 230, a circuit (e.g., an output buffer) 240, a memory cell array 250, and a data input/output pad 260. The self-refresh circuit 220, the low decoder 230, and the memory cell array 250 of the volatile memory device 200 are the same as the self-refresh circuit 120, the low decoder 130, and the memory cell array 150 of the volatile memory device 100 of FIG. 1.

The command decoder 210 decodes a self-refresh entry command SRE and a self-refresh exit command SRX based on external command signals CSB, RASB, CASB, WEB, and CKE received from outside the volatile memory device 200. For example, if the external command signal CKE transits from a high level to a low level when the external command signals CSB, RASB, and CASB are at a low level, and the external command signal WEB is at a high level, the command decoder 210 may provide the self-refresh entry command SRE to the self-refresh circuit 220. If the external command signal CKE transits from a low level to a high level, the command decoder 210 may provide the self-refresh exit command SRX to the self-refresh circuit 220. In certain embodiments, certain external commands may be implemented using a set of external command signals (e.g., CSB, RASB, CASB, WEB, and CKE) having a particular set of values. For example, one such external command may be a self-refresh entry command SRE and another may be a self-refresh exit command SRX. Each of these external commands corresponds to a particular set of external command signal values, which may be decoded by a command decoder 210 to form the decoded entry commands (SRE/SRX output from the command decoder 210).

Figure 9:
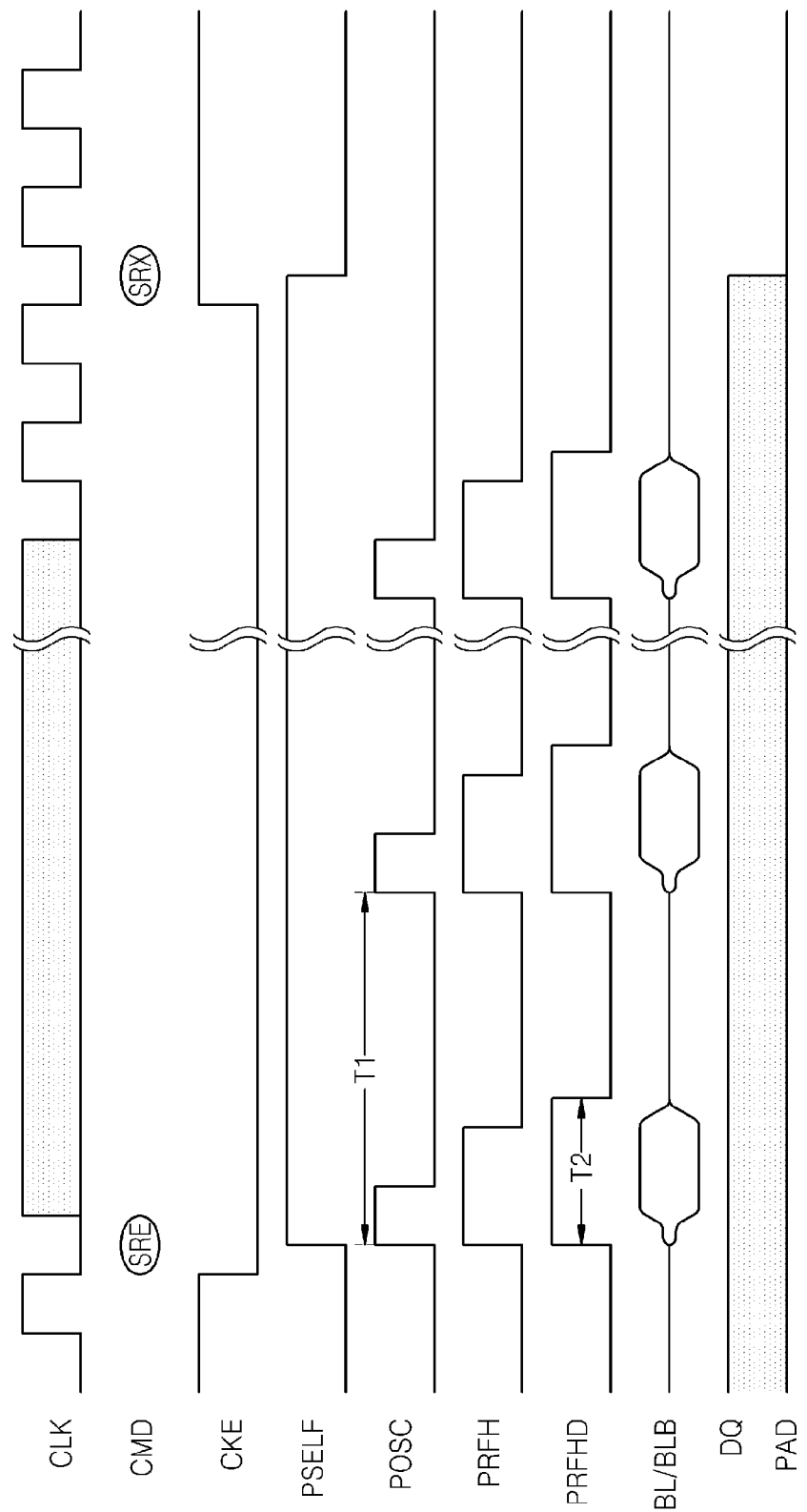
FIGS. 9 and 10 are timing diagrams of the volatile memory device of FIG. 7 having the output buffer of FIG. 8 according to exemplary embodiments.
Figure 10:
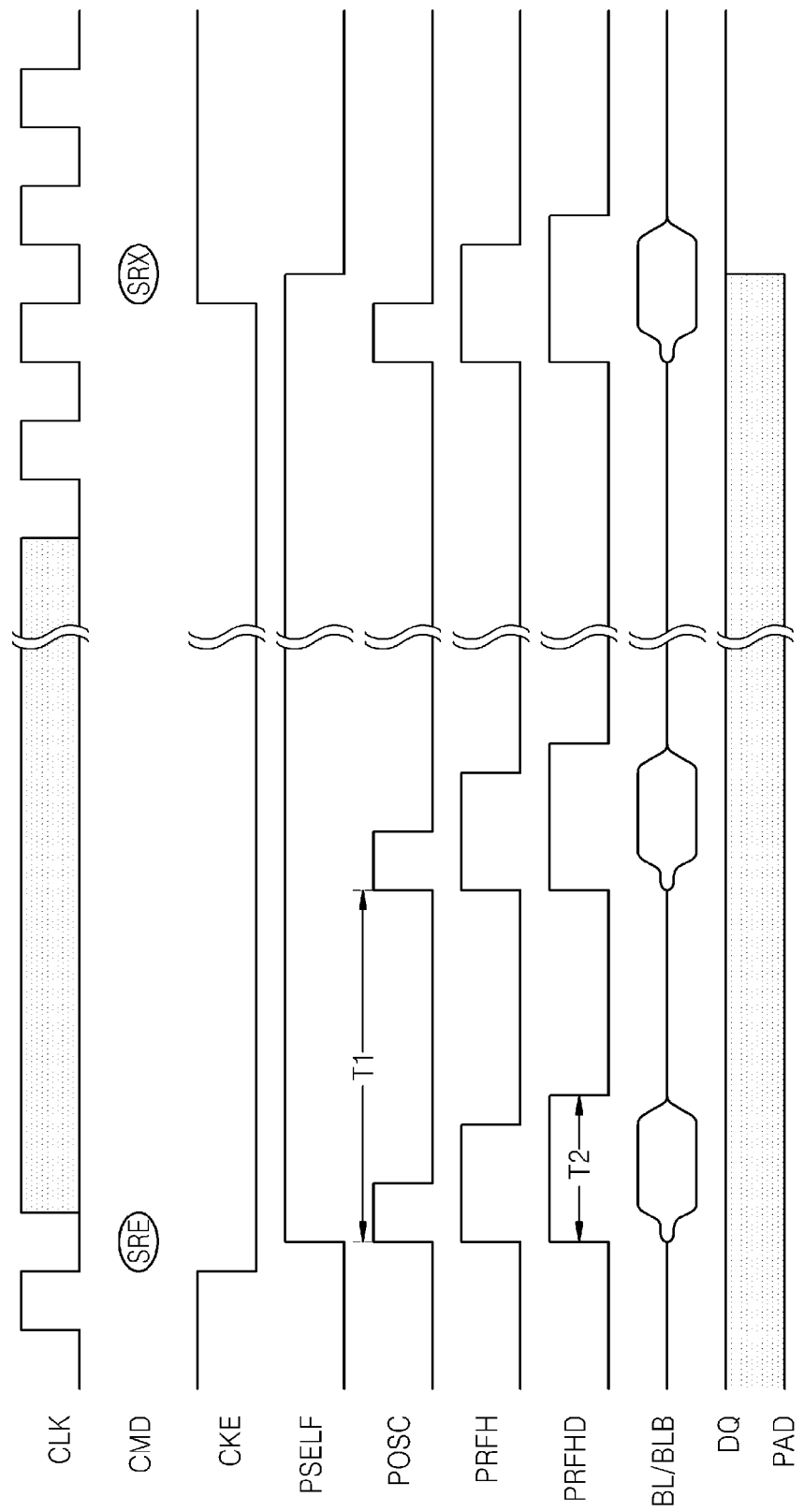

The self-fresh circuit 220 internally refreshes the memory cell array 250 (e.g., the memory cells) in response to the self-refresh entry command SRE and ends refreshing of the memory cell array 250 in response to the self-refresh exit command SRX. The self-refresh circuit 220 may generate various types of internal control signals as shown in FIGS. 9 and 10. The internal control signals may include a self-refresh mode signal PSELF, a self-refresh pulse signal POSC, and a self-refresh state signal PRFHD.

For example, the self-refresh mode signal PSELF is enabled in response to the self-refresh entry command SRE and is disabled in response to the self-refresh exit command SRX. The self-refresh pulse signal POSC may be a pulse signal which is periodically generated every first time period T1 during an enable period of the self-refresh mode signal PSELF. The first time period T1 may be equal to or shorter than an average time tREFI of refresh commands.

The self-refresh state signal PRFHD is enabled in response to the self-refresh pulse signal POSC and is disabled after a second time period T2. The second time period T2 may be equal to or longer than a refresh cycle time tRFC. Within the second time period T2, WLs of the memory cell array are enabled to sense and amplify data (e.g., a restoring operation) stored in MCs connected to the WLs and are disabled, and BLs are pre-charged to a predetermined voltage level.

The output buffer 240 outputs a state of the self-refresh state signal PRFHD through the data input/output pad 260 in response to the self-refresh exit command SRX. For example, the state of the self-refresh state signal PRFHD indicates that the volatile memory device 200 is either accessible or not accessible. In detail, the output buffer 240 may output a logic level of the self-refresh state signal PRFHD when the self-refresh mode signal PSELF transits from a high level to a low level in response to the self-refresh exit command SRX.

If the logic level of the data output from the data input/output pad 260 is a high level, the memory cell array 150 shows an inaccessible state thereof. If the logic level of the data output from the data input/output pat 260 is a low level, the memory cell array 150 shows an accessible state thereof FIG. 8 is a block diagram of an output buffer 240a of the volatile memory device 200 of FIG. 7, according to an exemplary embodiment.

Figure 8:
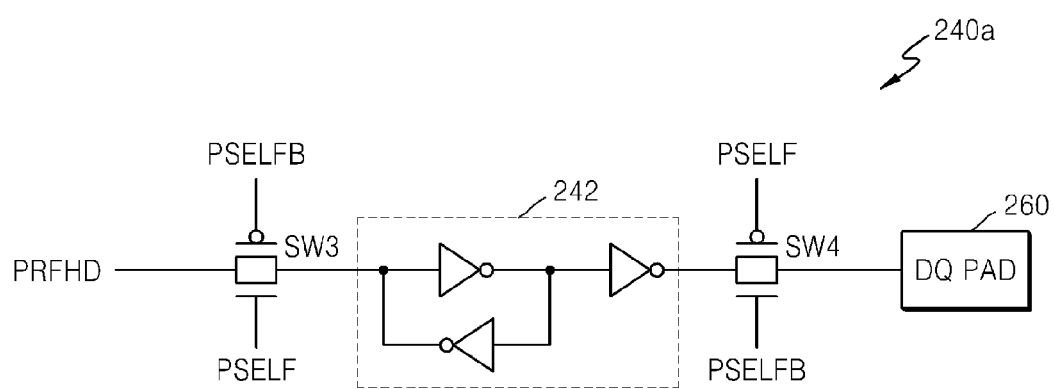
FIG. 8 is a block diagram illustrating an output buffer of the volatile memory device according to an exemplary embodiment.

Referring to FIG. 8, the output buffer 240a includes a third switch SW3, a buffer 242, and a fourth switch SW4.

The third switch SW3 provides a self-refresh state signal PRFHD to an input terminal of the buffer 242 under control of a self-refresh mode signal PSELF. The buffer 242 stores a logic level of the self-refresh state signal PRFHD and may include a plurality of inverters as shown in FIG. 8. The fourth switch SW4 outputs data stored in the buffer 242 to an external pad of the volatile memory device 200, such as a data input/output pad DQ in response to the self-refresh mode signal PSELF. The third switch SW3 is closed in an enable period of the self-refresh mode signal PSELF, and the fourth switch SW4 is closed in a disable period of the self-refresh mode signal PSELF. Therefore, the third and fourth switches SW3 and SW4 are closed and opened at opposite periods.

In the enable period of the self-refresh mode signal PSELF, the third switch SW3 is closed, and the buffer 242 stores the logic level of the self-refresh state signal PRFHD. For example, if the self-refresh state signal PRFHD transits to a high level, the buffer 242 stores a high logic level "1". If the self-refresh state signal PRFHD transits to a low level, the buffer 242 stores a low logic level "0". Since the fourth switch SW4 is opened, no signal is output from the data input/output pad 260 (e.g., a high-impedance Hi-Z).

When the self-refresh mode signal PSELF transits to a low level, the third switch SW3 is opened, and the buffer 242 maintains stored data just before the third switch SW3 is opened. Therefore, the buffer 242 may store the logic level of the self-refresh state signal PRFHD when the self-refresh mode signal PSELF transits to a low level. Also, since the fourth switch SW4 are closed, the data input/output pad 260 outputs the data stored in the buffer 242. For example, the data input/output pad 260 outputs the logic level of the self-refresh state signal PRFHD when the self-refresh mode signal PSELF transits to a low level. The data input/output pad 260 outputs the same data until the self-refresh mode signal PSELF re-transits to a high level.

The data input/output pad 260 does not output any signal in the enable period of the self-refresh mode signal PSELF and outputs a signal if the self-refresh mode signal PSELF is disabled. Therefore, power consumption may be reduced than a case in which every refresh operation logic state is output through the data input/output pad during a self-refresh mode.

FIGS. 9 and 10 are timing diagrams of the volatile memory device 200 of FIG. 7 having the output buffer 240a of FIG. 8 according to exemplary embodiments.

Referring to FIGS. 9 and 10, timings of an external clock signal CLK, a command CMD, an external command signal CKE, a self-refresh mode signal PSELF, a self-refresh pulse signal POSC, a self-refresh control signal PRFH, a self-refresh state signal PRFHD, BLs, and a data input/output pad DQ PAD are shown. The timing diagrams of FIGS. 9 and 10 are the same as those of FIGS. 2 and 3 except that there is no register read command REG READ, and the timing of the data input/output pad DQ PAD is included instead of a register signal REG.

As described above, the output buffer 240a of FIG. 8 stores a logic level of the self-refresh state signal PRFHD when the self-refresh mode signal PSELF transits to a low level.

As shown in FIG. 9, when the self-refresh mode signal PSELF transits to a low level in response to the self-refresh entry command SRE, the logic level of the self-refresh state signal PRFHD may be a low level. In this case, the data input/output pad DQ PAD outputs a signal having a low level after the self-refresh mode signal PSELF transits to a low level.

As shown in FIG. 10, when the self-refresh mode signal PSELF transits to a low level in response to the self-refresh entry command SRE, the logic level of the self-refresh state signal PRFHD may be a high level. In this case, the data input/output pad DQ PAD outputs a signal at a high level after the self-refresh mode signal PSELF transits to a high level.

Before the self-refresh mode signal PSELF transits to a low level, a signal output from the data input/output pad DQ PAD may have a high-impedance Hi-Z in the case of the output buffer 240a of FIG. 8. However, the inventive concept is not limited thereto, and thus, the output buffer 240 may output a low level or a high level before the self-refresh mode signal PSELF transits to a low level.

Figure 11:
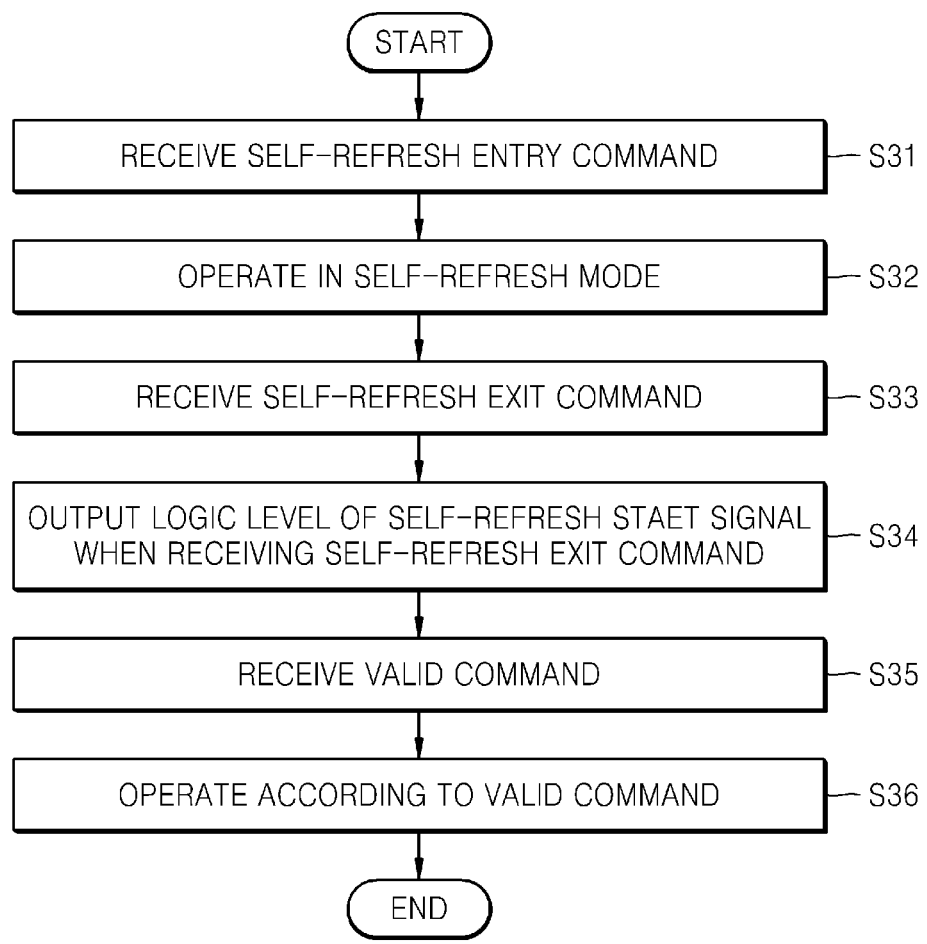
FIG. 11 is a flowchart illustrating an operation of a volatile memory device according to another exemplary embodiment.

FIG. 11 is a flowchart illustrating an operation of a volatile memory device according to an exemplary embodiment.

Referring to FIG. 11, in operation S31, the volatile memory device receives a self-refresh entry command SRE from a memory controller. In operation S32, the volatile memory device operates in a self-refresh mode when a memory cell array is internally refreshed by using an internal clock, in response to the self-refresh entry command SRE.

In operation S33, the volatile memory device receives a self-refresh exit command SRX from the memory controller. In operation S34, the volatile memory device stores a logic level of a self-refresh state signal PRFHD in an output buffer and outputs the logic level through a data input/output pad in response to the self-refresh exit command SRX.

In operation S35, the volatile memory device receives a valid command (e.g., an active, a read, or a write command) from the memory controller. In operation S36, the volatile memory device operates in a normal mode (e.g., an active, a read, or a write operation mode) according to the valid command.

Figure 12:
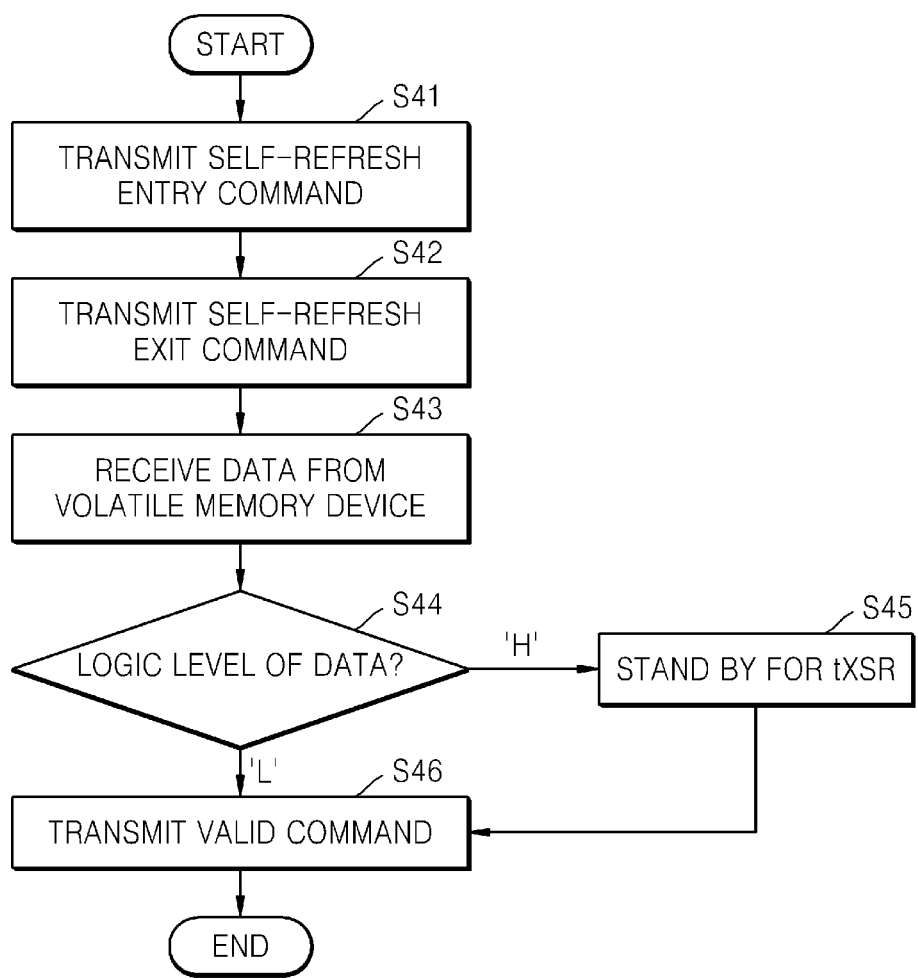
FIG. 12 is a flowchart illustrating an operation of a memory controller connected to a volatile memory device according to an exemplary embodiment.

FIG. 12 is a flowchart illustrating an operation of a memory controller connected to a volatile memory device according to an exemplary embodiment.

Referring to FIG. 12, in operation S41, the memory controller transmits a self-refresh entry command SRE to the volatile memory device. When the volatile memory device receives the self-refresh entry command SRE, the volatile memory device may operate in a self-refresh mode when a memory cell array is internally refreshed by using an internal clock, in response to the self-refresh entry command SRE.

In operation S42, the memory controller transmits a self-refresh exit command SRX to the volatile memory device. When the volatile memory device receives the self-refresh exit command SRX, the volatile memory device may output a logic level of a self-refresh state signal PRFHD when receiving the self-refresh exit command SRX, through a data input/output pad in response to the self-refresh exit command SRX.

In operation S43, the memory controller receives data output from the volatile memory device. In operation S44, the memory controller determines a logic level of the received data.

If the logic level of the received data is a low level, the volatile memory device is in an accessible state, and thus, the memory controller transmits a valid command to the volatile memory device without an additional standby time in operation S46. Although the logic level of the received data is a low level, the self-refresh state signal PRFHD may transit to a low level just before receiving the self-refresh exit command SRX. Therefore, the memory controller may transmit the valid command after standing by for a margin time, e.g., about 10 ns. The margin time may indicate a time for requiring to complete a self-refresh operation after the self-refresh exit command SRX is received.

If the logic level of the received data is a high level, the volatile memory device is in the accessible logic state, and thus, the memory controller stands by for a third time period in operation S45. The third time period may be equal to or longer than a time between a self-refresh exit and a next valid command delay tXSR. The third time period may be calculated after the self-refresh exit command SRX is transmitted. In operation S46, the memory controller transmits the valid command to the volatile memory device after standing by for the third time period from when transmitting the self-refresh exit command SRX.

As described above, if the volatile memory device does not inform the memory controller whether the volatile memory device is in the accessible state, the memory controller may transmit the self-refresh exit command SRX and then stand by for the time between a self refresh exit and the next valid command delay tXSR. However, according to certain disclosed embodiments, after the memory controller transmits the self-refresh exit command SRX, the memory controller knows whether the volatile memory device is in an accessible or a non-accessible state through a signal provided from the volatile memory device. If the volatile memory device is in an accessible state, the memory controller may transmit a valid command (e.g., an active, a read, or a write command) to the volatile memory device without standing by or may transmit the valid command after standing by for only the margin time (e.g., 10 ns). Therefore, an average standby time may be considerably reduced.

Figure 13:
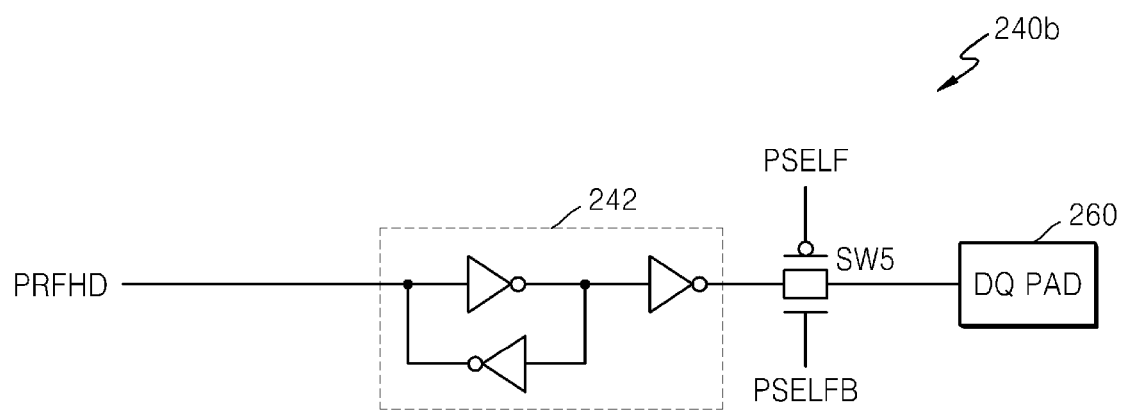
FIG. 13 is a block diagram illustrating an output buffer of the volatile memory device of FIG. 7, according to another exemplary embodiment.

FIG. 13 is a block diagram of an output buffer 240b of the volatile memory device 200 of FIG. 7, according to another exemplary embodiment.

Referring to FIG. 13, the output buffer 240b includes a buffer 242 and a fifth switch SW5.

The buffer 242 continuously stores a logic level of a self-refresh state signal PRFHD and includes a plurality of inverters as shown in FIG. 13. The fifth switch SW5 outputs data stored in the buffer 242 through an external pad of the volatile memory device 200, such as a data input/output pad DQ under control of a self-refresh mode signal PSELF. The fifth switch SW5 is opened in an enable period of the self and closed in a disable period of the self-refresh mode signal PSELF.

Since the fifth switch SW5 is opened in the enable period of the self-refresh mode signal PSELF, no signal is output from a data input/output pad 260.

If the self-refresh mode signal PSELF transits a low level, the fifth switch SW5 shorts, and the data input/output pad 260 outputs a self-refresh state signal PRFHD transmitted through the buffer 242. The buffer 242 may operate as a delayer.

If a logic level of the self-refresh state signal PRFHD is changed after the self-refresh mode signal PSELF transits to a low level, a logic level of a signal output from the data input/output pad 260 is changed. For example, if the self-refresh state mode signal PRFHD transits to a low level after the self-refresh mode signal PSELF transits to the low level, the data input/output pad 260 outputs a signal having a falling edge corresponding to a falling edge of the self-refresh state signal PRFHD.

Figure 14:
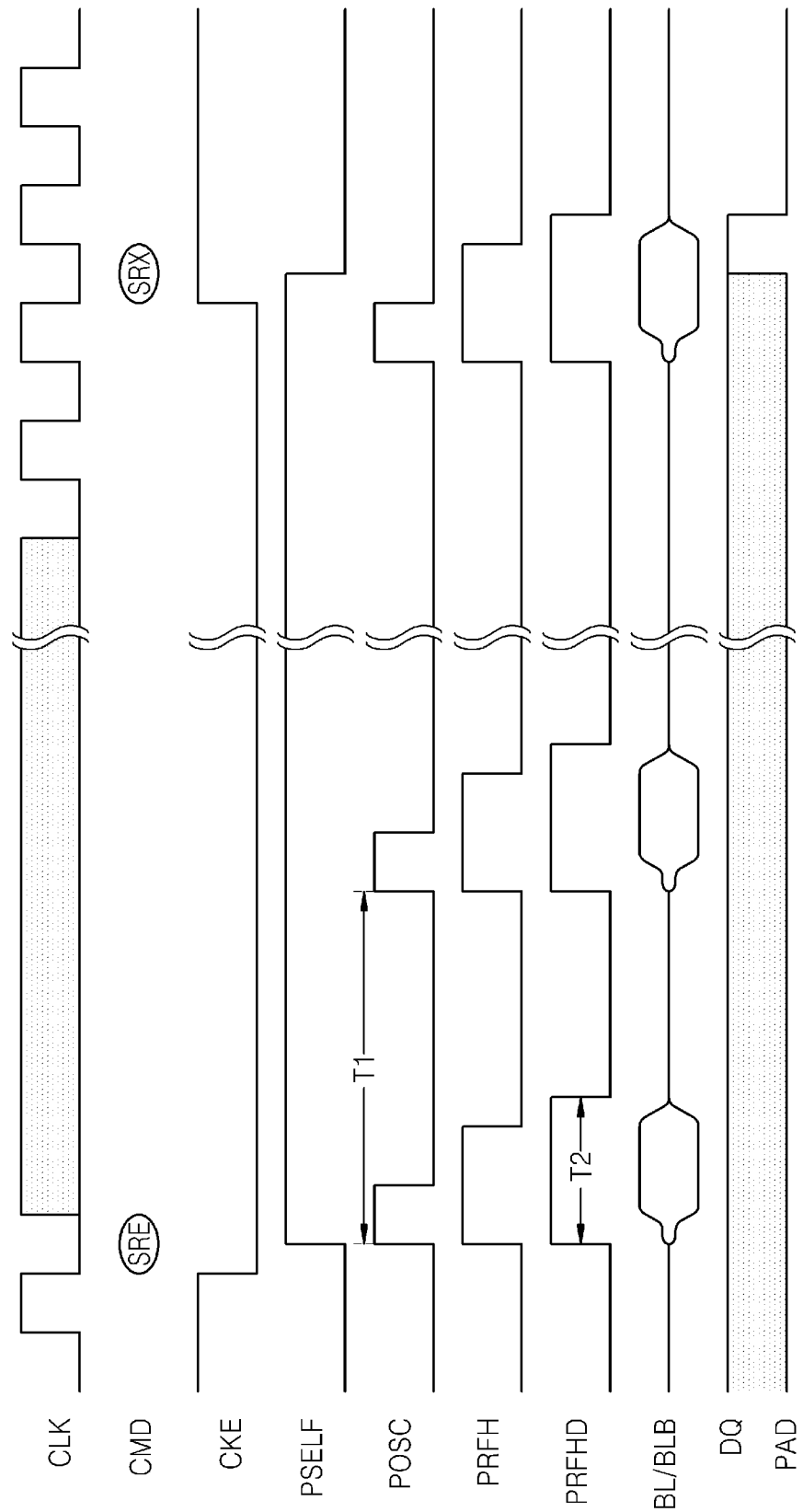
FIG. 14 is a timing diagram illustrating the volatile memory device of FIG. 7 having the output buffer of FIG. 13 according to an exemplary embodiment.

FIG. 14 is a timing diagram of the volatile memory device 200 of FIG. 7 having the output buffer 240b of FIG. 13 according to an exemplary embodiment.

Referring to FIG. 14, timings of an external clock signal CLK, a command CMD, an external command signal CKE, a self-refresh mode signal PSELF, a self-refresh pulse signal POSC, a self-refresh control signal PRFH, a self-refresh state signal PRFHD, BLs, and a data input/output pad DQ PAD are shown. The timing diagram of FIG. 14 is identical to the timing diagram of FIG. 10 except for an output signal of the data input/output pad DQ PAD.

As described above, the output buffer 240a of FIG. 8 outputs a state of the self-refresh state signal PRFHD when the self-refresh mode signal PSELF transits to a low level.

As shown in FIG. 14, when the self-refresh mode signal PSELF transits to a low level, a logic level of the self-refresh state signal PRFHD may be a high level. If pre-charging of the BLs is completed, the self-refresh state signal PRFHD may transit to a low level. In this case, after the self-refresh state signal PRFHD transits to a low level, the data input/output pad DQ PAD outputs the same signal as the low level of the self-refresh state signal PRFHD. For example, when the self-refresh mode signal PSELF transits to a low level, the data input/output pad DQ PAD outputs a signal having a high level like the self-refresh state mode signal. However, if the self-refresh state signal PRFHD transits to a low level, the data input/output pad PQ PAD outputs a signal having a low level.

Figure 15:
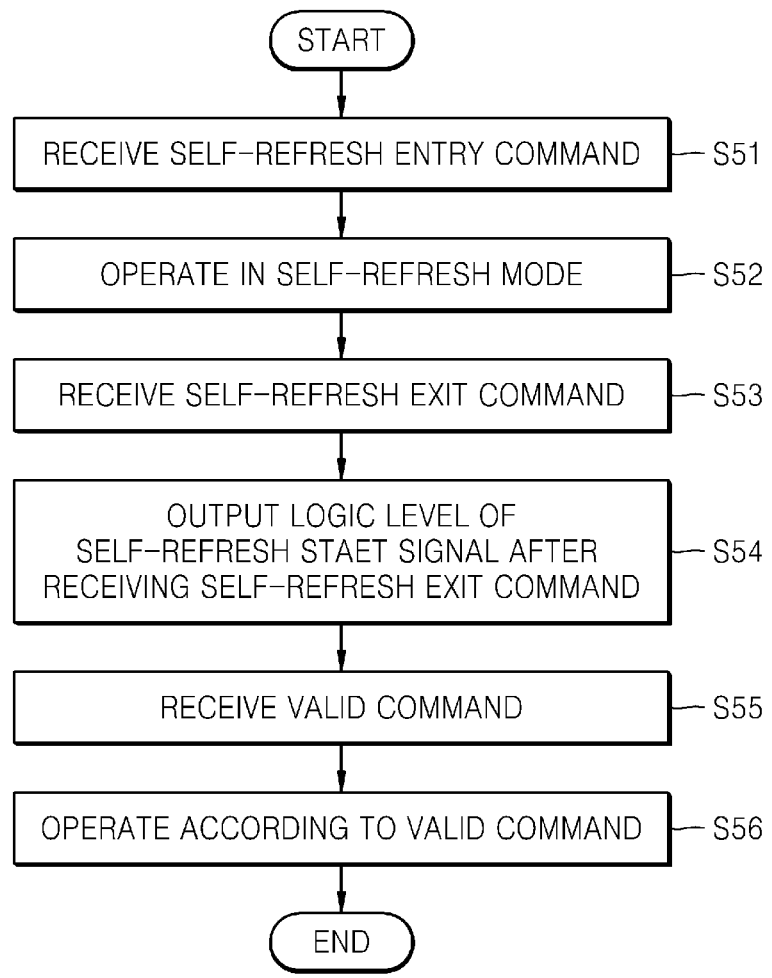
FIG. 15 is a flowchart illustrating an operation of a volatile memory device according to an exemplary embodiment.

FIG. 15 is a flowchart illustrating an operation of a volatile memory device according to an exemplary embodiment.

Referring to FIG. 15, in operation S51, the volatile memory device receives a self-refresh entry command SRE from a memory controller. In operation S52, the volatile memory device operates in a self-refresh mode when a memory cell array is internally refreshed by using an internal clock, in response to the self-refresh entry command SRE.

In operation S53, the volatile memory device receives a self-refresh exit command SRX from the memory controller. In operation S54, the volatile memory device outputs a self-refresh state signal PRFHD through a data input/output pad in real time in response to the self-refresh exit command SRX.

In operation S55, the volatile memory device receives a valid command (e.g., an active, a read, or a write command) from the memory controller. In operation S56, the volatile memory device operates in a normal mode (e.g., an active, a read, or a write operation mode) according to the register valid command.

Figure 16:
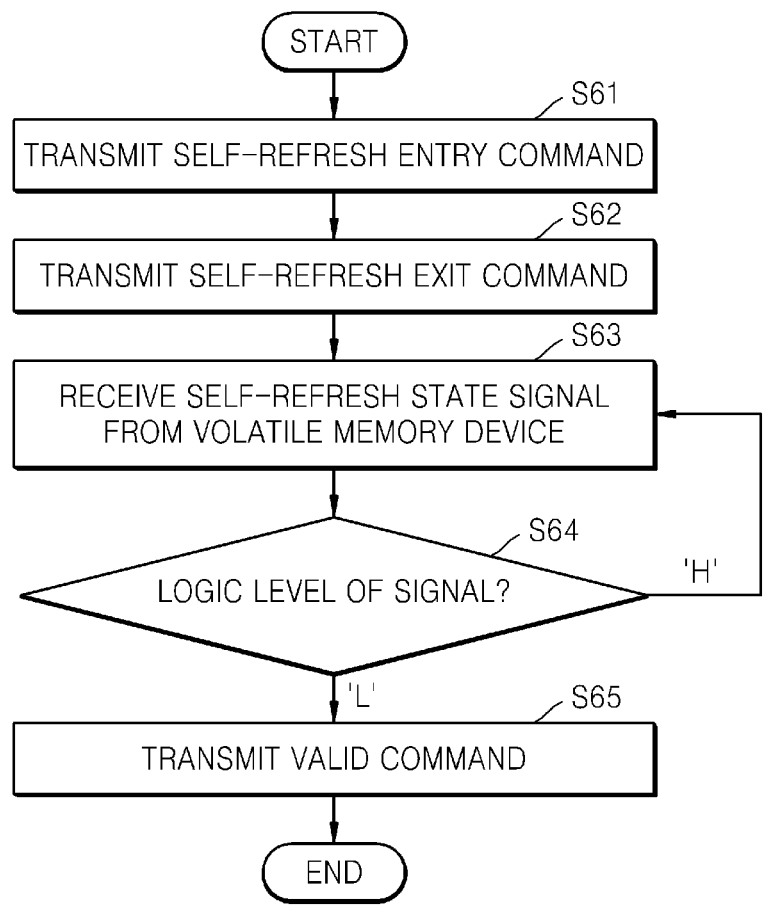
FIG. 16 is a flowchart illustrating an operation of a memory controller connected to a volatile memory device according to an exemplary embodiment.

FIG. 16 is a flowchart illustrating an operation of a memory controller connected to a volatile memory device according to an exemplary embodiment.

Referring to FIG. 16, in operation S61, the memory controller transmits a refresh entry command SRE to the volatile memory device. If the volatile memory device receives the self-refresh entry command SRE, the volatile memory device operates in a self-refresh mode when a memory cell array is internally refreshed by using an internal clock in response self-refresh entry command SRE.

In operation S62, the memory controller transmits a self-refresh exit command SRX to the volatile memory device. If the volatile memory device receives the self-refresh exit command SRX, the volatile memory device may output a self-refresh state signal PRFHD through a data input/output pad in real time in response to the self-refresh exit command SRX.

In operation S63, the memory controller receives the self-refresh state signal PRFHD from the volatile memory device. In operation S64, the memory controller determines a logic level of the self-refresh state signal PRFHD.

If a logic level of a received signal is a low level, the volatile memory vice is in an accessible state, and thus, the memory controller transits a valid command to the volatile memory device in operation S65. According to another exemplary embodiment, the memory controller may transmit a valid command after a margin time, e.g., after standing by for 10 ns. The margin time may indicate a time required to complete a self-refresh operation after the self-refresh exit command SRX is received.

If the logic level of the received signal is a high level, the volatile memory device is in non-accessible state, and thus, the process returns to operation S63 to determine whether the logic level of the received signal is a low level. The memory controller repeats operations S63 and S64 until the logic level of the received signal is a low level. If the logic level of the received signal falls to a low level, the memory controller proceeds to operation S65.

As described above, if the volatile memory device does not inform the memory controller whether the volatile memory device is in the accessible state, the memory controller transmits the self-refresh exit command SRX and then stands by the time between a self refresh exit and the next valid command delay tXSR. However, according to the disclosed embodiment, after the memory controller transmits the self-refresh exit command SRX, the memory controller knows the accessible state of the volatile memory device in real time. If the volatile memory device is in an accessible state, the memory controller may transmit a valid command (e.g., an active, a read, or a write command) to the volatile memory device without an additional standby time or may transmit the valid command after standing by for a margin time. Although the volatile memory device is in an inaccessible state, the memory controller may sense the inaccessible state of the volatile memory device in real time, thereby minimizing a standby time. Therefore, an average standby time may be considerably reduced.

Figure 17:
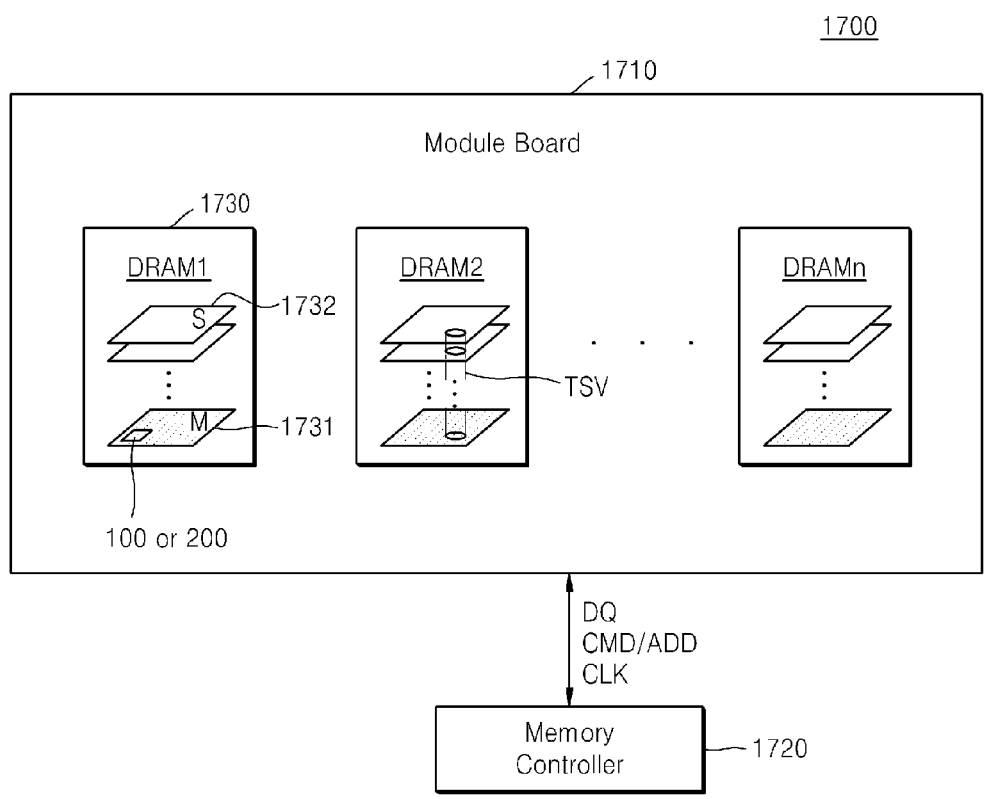
FIG. 17 is a block diagram illustrating a memory system including a semiconductor memory device of the disclosed embodiments according to an exemplary embodiment.

FIG. 17 is a view illustrating a memory system 1700 including a semiconductor memory device of the disclosed embodiments according to an exemplary embodiment.

Referring to FIG. 17, the memory system 1700 includes a memory module 1710 and a memory controller 1720. The memory module 1710 includes a module board on which at least one or more semiconductor memory devices 1730 are mounted. The semiconductor memory devices 1730 may be realized as dynamic random access memories (DRAMs) and may each include a plurality of semiconductor layers. The semiconductor layers include at least one or more master chips 1731 and at least one or more slave chips 1732. A signal transmission between the semiconductor layers may be performed through through-substrate vias (e.g., through-silicon vias) or TSVs.

The master chips 1731 may perform a self-refresh operation according to exemplary embodiments. The master chips 1731 may include the volatile memory device 100 of FIG. 1 or the volatile memory device 200 of FIG. 7.

The memory module 1710 communicates with the memory controller 1720 through a system bus. Data DQ, a command/address CMD/ADD, and a clock signal CLK may be transmitted and received between the memory module 1710 and the memory controller 1720 through the system bus.

The semiconductor memory devices 1730 may operate according to the operation flowcharts of FIGS. 5, 11, and 15. The memory controller 1720 may operate according to the operation flowcharts of FIGS. 6, 12, and 16.

Figure 18:
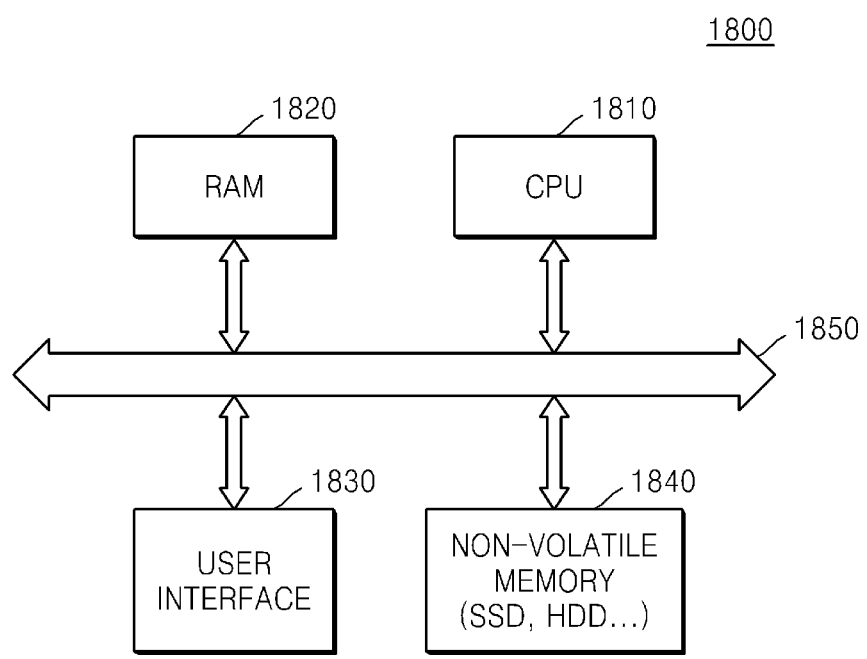
FIG. 18 is a block diagram illustrating a computing system including a memory system according to an exemplary embodiment.

FIG. 18 is a block diagram illustrating a computing system 1800 including a memory system according to an exemplary embodiment.

Referring to FIG. 18, a random access memory (RAM) 1820 including the volatile memory device 100 or 200 of the disclosed herein is installed in the computing system 1800 such as a mobile device or a desktop computer. A volatile memory device which may be included in the RAM 1820 may be one of volatile memory devices according to the above-described exemplary embodiments. For example, the RAM 1820 may be one of volatile memory devices described in the above disclosed embodiments or may be a memory module such as disclosed in connection with FIG. 17. The RAM 1820 may also include a semiconductor memory device and a memory controller.

The computing system 1800 according to the present exemplary embodiment includes a central processing unit (CPU) 1810, the RAM 1820, a user interface 1830, and a non-volatile memory 1840 which are electrically connected to a bus 1850. The non-volatile memory 1840 may be a large capacity storage device such as a solid state drive (SSD) or a hard disk drive (HDD).

While the inventive concept has been particularly shown and described with reference to exemplary embodiments thereof, it will be understood that various changes in form and details may be made therein without departing from the spirit and scope of the following claims.

What is claimed is:

1. A volatile memory device comprising:
    a memory cell array including a plurality of word lines, a plurality of bit lines, and a plurality of memory cells connected to the word lines and bit lines;
    a command decoder configured to decode a self-refresh entry command, a self-refresh exit command, and a register read command from external command signals received from outside the volatile memory device;
    a self-refresh circuit configured to automatically refresh the memory cell array during a self-refresh mode which be entered in response to the self-refresh entry command and be exited in response to the self-refresh exit command; and
    a register configured to store an accessible state in response to the self-refresh exit command, and output the stored accessible state in response to the register read command, the accessible state indicating whether or not the memory cell array is ready to be read or written.

2. The volatile memory device of claim 1, wherein the self-refresh circuit is further configured to generate a self-refresh mode signal which is enabled in response to the self-refresh entry command and is disabled in response to the self-refresh exit command, a self-refresh pulse signal which is periodically generated every first time period during an enable period of the self-refresh mode signal, and a self-refresh state signal which is enabled in response to the self-refresh pulse signal and is disabled after a second time period.

3. The volatile memory device of claim 2, wherein the register stores a logic level of the self-refresh state signal at a moment when the self-refresh mode signal is disabled as the accessible state.

4. The volatile memory device of claim 3, wherein the first time period is an average time between refresh commands, and the second time period is a refresh cycle time.

5. The volatile memory device of claim 2, wherein the register comprises a buffer, and
    wherein the self-refresh state signal is input into the buffer during an enable period of the self-refresh mode signal, and data stored in the buffer is output in response to the register read command.

6. A memory system comprising:
    the volatile memory device of claim 1; and
    a memory controller connected to the volatile memory device,
    wherein the memory controller is configured to transmit an external command signal corresponding to the self-refresh exit command to the volatile memory device, transmit an external command signal corresponding to the register read command to the volatile memory device, receive data corresponding to the accessible state stored in the register of the volatile memory device from the volatile memory device, and transmit an external command signal corresponding to a valid command with or without an additional delay for a third time period according to a logic level of the received data.

7. The memory system of claim 6, wherein the third time period is a time of a self refresh exit to next valid command delay.

8. The memory system of claim 6, wherein if the logic level of the received data is a first level, the memory controller is further configured to transmit the external command signal corresponding to the valid command after standing by for the third time period after receiving the data.

9. The memory system of claim 8, wherein if the logic level of the received data is a second level different from the first level, the memory controller is further configured to transmits the external command signal corresponding to the valid command immediately after receiving the data.

10. A volatile memory device comprising:
    a memory cell array including a plurality of word lines, a plurality of bit lines, and a plurality of memory cells connected to the word lines and bit lines;
    a command decoder configured to decode a self-refresh entry command and a self-refresh exit command from external command signals received from outside the volatile memory device;
    a self-refresh circuit configured to automatically refresh the memory cell array during a self-refresh mode which be entered in response to the self-refresh entry command and be exited in response to the self-refresh exit command; and
    an output buffer configured to output an accessible state in response to the self-refresh exit command, the accessible state indicating whether or not the memory cell array is ready to be read or written.

11. The volatile memory device of claim 10, wherein the self-refresh circuit is further configured to generate a self-refresh mode signal which is enabled in response to the self-refresh entry command and is disabled in response to the self-refresh exit command, a self-refresh pulse signal which is periodically generated every first time period during an enable period of the self-refresh mode signal, and a self-refresh state signal which is enabled in response to the self-refresh pulse signal and is disabled after a second time period.

12. The volatile memory device of claim 11, wherein the output buffer outputs a logic level of the self-refresh state signal at a moment when the self-refresh mode signal is disabled as the accessible state.

13. The volatile memory device of claim 12, wherein the output buffer comprises a buffer having an input terminal and an output terminal, an input switch connected to the input terminal, and an output switch connected to the output terminal, and wherein the input switch is closed in an enable period of the self-refresh mode signal to store the logic level of the self-refresh state signal in the buffer, and the output switch is closed to output data stored in the buffer in response to the self-refresh exit command.

14. The volatile memory device of claim 11, wherein the output buffer outputs the self-refresh state signal after the self-refresh mode signal is disabled.

15. The volatile memory device of claim 14, wherein the output buffer comprises a buffer having an input terminal and an output terminal and an output switch connected to the output terminal, and wherein the self-refresh state signal is input to the buffer through the input terminal, and the output switch is closed to output the self-refresh state signal in response to the self-refresh exit command.

16. A memory system comprising:
the volatile memory device of claim 14; and
a memory controller connected to the volatile memory device,
wherein the memory controller is configured to transmit an external command signal corresponding to the self-refresh exit command to the volatile memory device, receive the self-refresh state signal output from the output buffer of the volatile memory device from the volatile memory device, and transmit an external command signal corresponding to a valid command with or without an additional delay for a third time period according to a logic level of the received self-refresh state signal.

17. The memory system of claim 16, wherein if the logic level of the received self-refresh state signal is a first level, the memory controller is further configured to transmit the external command signal corresponding to the valid command after standing by until the received self-refresh state signal transits from the first level to a second level different from the first level, and if the logic level of the received data is the second level, the memory controller is further configured to transmits the external command signal corresponding to the valid command immediately after receiving the self-refresh state signal.

18. A memory system comprising:
the volatile memory device of claim 10; and
a memory controller connected to the volatile memory device,
wherein the memory controller is configured to transmit an external command signal corresponding to the self-refresh exit command to the volatile memory device, receive data corresponding to the accessible state output from the output buffer of the volatile memory device from the volatile memory device, and transmit an external command signal corresponding to a valid command with or without an additional delay according to a logic level of the received data.

19. The memory system of claim 18, wherein if the logic level of the received data is a first level, the memory controller is further configured to transmit the external command signal corresponding to the valid command after standing by for a time of a self refresh exit to next valid command delay after receiving the data.

20. The memory system of claim 19, wherein if the logic level of the received data is a second level different from the first level, the memory controller is further configured to transmits the external command signal corresponding to the valid command immediately after receiving the data.

* * * * *